United States Patent
Yashiki et al.

(10) Patent No.: US 9,519,115 B2
(45) Date of Patent: Dec. 13, 2016

(54) OPTICAL CIRCUIT

(71) Applicant: Photonics Electronics Technology Research Association, Tokyo (JP)

(72) Inventors: Kenichiro Yashiki, Tokyo (JP); Masatoshi Tokushima, Tokyo (JP)

(73) Assignee: PHOTONICS ELECTRONICS TECHNOLOGY RESEARCH ASSOCIATION, Tokyo (JP)

( * ) Notice: Subject to any disclaimer, the term of this patent is extended or adjusted under 35 U.S.C. 154(b) by 0 days.

(21) Appl. No.: 14/780,449

(22) PCT Filed: Mar. 19, 2014

(86) PCT No.: PCT/JP2014/057541
§ 371 (c)(1),
(2) Date: Sep. 25, 2015

(87) PCT Pub. No.: WO2014/156885
PCT Pub. Date: Oct. 2, 2014

(65) Prior Publication Data
US 2016/0054529 A1    Feb. 25, 2016

(30) Foreign Application Priority Data

Mar. 25, 2013    (JP) .................................. 2013-062645

(51) Int. Cl.
*G02F 1/035*    (2006.01)
*G02B 6/124*    (2006.01)
(Continued)

(52) U.S. Cl.
CPC ......... *G02B 6/4207* (2013.01); *G02B 6/12004* (2013.01); *G02B 6/125* (2013.01);
(Continued)

(58) Field of Classification Search
CPC .............................. G02B 6/125; G02B 6/4207
See application file for complete search history.

(56) References Cited

U.S. PATENT DOCUMENTS

| | | | |
|---|---|---|---|
| 7,983,318 B2 * | 7/2011 | Hayakawa | ............. B82Y 20/00 372/20 |
| 8,168,939 B2 | 5/2012 | Mack et al. | |

(Continued)

FOREIGN PATENT DOCUMENTS

| | | |
|---|---|---|
| JP | H03-259203 A | 11/1991 |
| JP | H09-269428 A | 10/1997 |

(Continued)

OTHER PUBLICATIONS

International Search Report issued in PCT Application No. PCT/JP2014/057541, dated Jun. 24, 2014.

*Primary Examiner* — Omar R Rojas
(74) *Attorney, Agent, or Firm* — Michael Best & Friedrich LLP

(57) ABSTRACT

An optical circuit, wherein the effects of reflected light generated by an optical component are reduced. The optical circuit (100) is provided with an optical branching (110) for branching light, an optical coupler (114) for coupling a first portion of branched light to an optical waveguide (118) for transmission, and an optical reflecting unit (116) for reflecting a second portion of the branched light, the phase difference between the reflected light from the optical coupler (114) and the reflected light from the optical reflecting unit (116) being $(2m-1)\pi$ (where m is an integer) on an input side of the optical branching (110).

17 Claims, 13 Drawing Sheets

(51) Int. Cl.
  *G02B 6/125*   (2006.01)
  *G02B 6/42*    (2006.01)
  *G02B 6/30*    (2006.01)
  *G02B 6/34*    (2006.01)
  *G02B 6/12*    (2006.01)
  *G02B 6/28*    (2006.01)

(52) U.S. Cl.
  CPC ............... *G02B 6/305* (2013.01); *G02B 6/34* (2013.01); *G02B 6/28* (2013.01); *G02B 2006/12123* (2013.01); *G02B 2006/12142* (2013.01)

(56) References Cited

U.S. PATENT DOCUMENTS

| | | | |
|---|---|---|---|
| 2003/0099420 A1* | 5/2003 | Bhowmik | G02B 6/1221 385/2 |
| 2010/0020840 A1 | 1/2010 | Hayakawa | |
| 2012/0155888 A1 | 6/2012 | Ji et al. | |

FOREIGN PATENT DOCUMENTS

| | | |
|---|---|---|
| JP | 2007-047534 A | 2/2007 |
| JP | 2009-204694 A | 9/2009 |
| JP | 2012-133363 A | 7/2012 |
| WO | WO-2008/107963 A1 | 9/2008 |

* cited by examiner

OPTICAL CIRCUIT

TECHNICAL FIELD

The present invention relates to an optical circuit, and in particular, to an optical circuit that prevents deterioration of performance due to reflected light.

BACKGROUND ART

In an optical communication system, it is required to stabilize the operation of a semiconductor laser used as a light source.

To do so, in Patent-related Document 1, it is suggested to prevent light reflected by a wavelength filter from returning to a semiconductor laser, when monitoring oscillation wavelength of the semiconductor laser by using, via the wavelength filter, an optical detector.

In Patent-related Document 2, it is suggested to guide the light reflected by an optical resonator placed within an external modulator, toward a direction different from a direction of a semiconductor laser.

However, each of these techniques merely prevents light reflected in a semiconductor laser module from returning to a semiconductor laser source. Thus, even if an optical communication system is constructed by use of such a module, light will be reflected at positions of connection of other optical components succeeding to an optical modulator.

One method for solving the above problem is shown in Patent-related Document 3, wherein an optical isolator is placed near an outputting end of a semiconductor laser for preventing reflected light from returning to the semiconductor laser. However, since the optical isolator is an expensive optical component, this construction will increase the cost.

CITATION LIST

Patent-Related Documents

Patent-related Document 1: PCT pamphlet No. WO2008/107963
Patent-related Document 2: Japanese Patent Application Public Disclosure No. 2009-204694
Patent-related Document 3: U.S. Pat. No. 8,168,939

SUMMARY OF INVENTION

Technical Problem

The present invention provides an optical circuit that reduces effect due to light reflected by optical components, at low cost.

Solution to Problem

In an embodiment of the present invention, an optical circuit comprises: a first branching part configured to branch light; a first optical coupler configured to couple first branched light in the branched light to a first optical waveguide for transmission; and an optical reflection part configured to reflect second branched light in the branched light; wherein, at an input side of the first branching part, a phase difference between a phase of reflected light from the first optical coupler and a phase of reflected light from the optical reflection part is $(2m-1)\pi$ (m is an integer).

In another embodiment of the present invention, a difference between a length of a second optical waveguide placed between the first branching part and the first optical coupler and a length of a third optical waveguide placed between the first branching part and the optical reflection part is equal to or less than one hundredth of $(c/n_g)\times(1/k)$ (unit thereof is meter (m)), wherein $n_g$ is a group refractive index of the second optical waveguide and the third optical waveguide, c (m/s) is the velocity of light, and k (bps) is a transmission rate of a signal.

In another embodiment of the present invention, the first branching part comprises at least two inputs; an optical detector is coupled to one of the at least two inputs; a first optical phase adjusting part is provided on the third optical waveguide; and the first optical phase adjusting part is controllable in such a manner that optical power detected by the optical detector is made maximum. Further, a second optical phase adjusting part may be provided on the second optical waveguide.

In another embodiment of the present invention, the optical circuit further comprises a light source, and an optical modulator configured to modulate light emitted from the light source and output a modulated optical signal. The optical modulator comprises at least two inputs; an optical detector is coupled to one of the at least two inputs; an output of the optical modulator is connected to the first branching part; a first optical phase adjusting part is provided on the third optical waveguide; and the first optical phase adjusting part is controllable in such a manner that optical power detected by the optical detector is made minimum. Further, a second optical phase adjusting part may be provided on the second optical waveguide.

In another embodiment of the present invention, the optical reflection part is a second optical coupler; and reflected light from the first optical coupler and reflected light from the second optical coupler is coupled to the same first optical waveguide.

In another embodiment of the present invention, the first optical coupler and the second optical coupler are a first grating coupler and a second grating coupler, respectively; and the first waveguide is a multimode optical waveguide.

In another embodiment of the present invention, the optical circuit is formed on one same substrate; and the first grating coupler and the second grating coupler are placed in parallel with each other; and diffraction angles of the first grating coupler and the second grating coupler with respect to the substrate are the same and are oppositely oriented with each other.

In another embodiment of the present invention, the first grating coupler and the second grating coupler are placed in parallel with each other; a grating of the first grating coupler is formed to be slanted with respect to the second optical waveguide; a grating of the second grating coupler is formed to be orthogonal to the third optical waveguide; and the first grating coupler and the second grating coupler are constructed in such a manner that absolute values of reflection coefficients of them are approximately the same, although phases of the reflection coefficients of them are different from each other.

In another embodiment of the present invention, the optical circuit further comprises a light source; a second branching part configured to branch light emitted from the light source; a first optical modulator configured to modulate a first part of light from the second branching part and output a modulated optical signal; and a second optical modulator configured to modulate a second part of the light from the second branching part and output a modulated optical signal.

The optical circuit is constructed in such a manner that, at a light-source side of the second branching part, a phase difference between a phase of reflected light from the first optical modulator and a phase of reflected light from the second optical modulator is $(2m-1)\pi$ (m is an integer).

In another embodiment of the present invention, the optical reflection part has a reflection characteristic that is the same as that of the first optical coupler.

In another embodiment of the present invention, a difference between a phase of the reflection coefficient of the first optical coupler and a phase of the reflection coefficient of the optical reflection part is $\phi$; and a difference between an optical path length between a light-source side of the first branching part and the first optical coupler and an optical path length between the light-source side of the first branching part and the optical reflection part, for one way, is $((m-1/2)-\phi/\pi/2)\lambda/2$, wherein m is an integer, and $\lambda$ is a wavelength of light.

In another embodiment of the present invention, regarding the first branching part having the 1×2 construction comprising a branching construction in which one input is provided and no phase difference between phases at two outputting sides is generated, an optical path length between the first branching part and the first optical coupler and an optical path length between the first branching part and the optical reflection part are the same; and a phase difference between a phase of light reflected form the first optical coupler at an incident end of the first optical coupler and a phase of light reflected form the optical reflection part at an incident end of the optical reflection part is $(2m-1)\pi$, and m is an integer.

In another embodiment of the present invention, the optical circuit is formed on a same substrate; and the first optical coupler and the optical reflection part are a first grating coupler and a second grating coupler, respectively. Pitches of gratings of the first grating coupler and the second grating coupler are determined in such a manner that detuning for the first grating coupler is made to be $\delta=\kappa$ and detuning for the second grating coupler is made to be $\delta=-\kappa$. In the above, $\kappa$ is a coupling constant, $\delta=\beta-K$, $\beta$ is a propagation coefficient of light, $K=2\pi/\Lambda$, and $\Lambda$ is a grating pitch.

In another embodiment of the present invention, it may be possible to place a fourth optical waveguide extending from the second branching part to the first optical modulator and a fifth optical waveguide extending from the second branching part to the second optical modulator in such a manner that they are separated from each other for a distance that prevents them from being coupled with each other as a directional coupler, and that they are placed in parallel with each other with a distance equal to or less than 50 µm therebetween. Also, it may be possible to place a second optical waveguide extending from the first branching part to the first optical coupler and a third optical waveguide extending from the first branching part to the optical reflection part in such a manner that they are separated from each other for a distance that prevents them from being coupled with each other as a directional coupler, and that they are placed in parallel with each other with a distance equal to or less than 50 µm therebetween.

In another embodiment of the present invention, the optical reflection part is an optical power monitor. Also, a phase difference is generated by changing an optical path length by at least one of (a) changing the length of a straight part of the optical waveguide, (b) changing the bend radius of the optical waveguide, (c) changing the width of the optical waveguide, (d) changing the height of the optical waveguide, (e) changing the temperature of the optical waveguide, (f) changing the stress applied to the optical waveguide, and (g) changing at least one material of the core or the clad of the optical waveguide.

Advantageous Effects of Invention

According to the present invention, an optical circuit that reduces effect due to light reflected by optical components and that is constructed at low cost can be realized.

DESCRIPTION OF EMBODIMENTS

Figure 1:
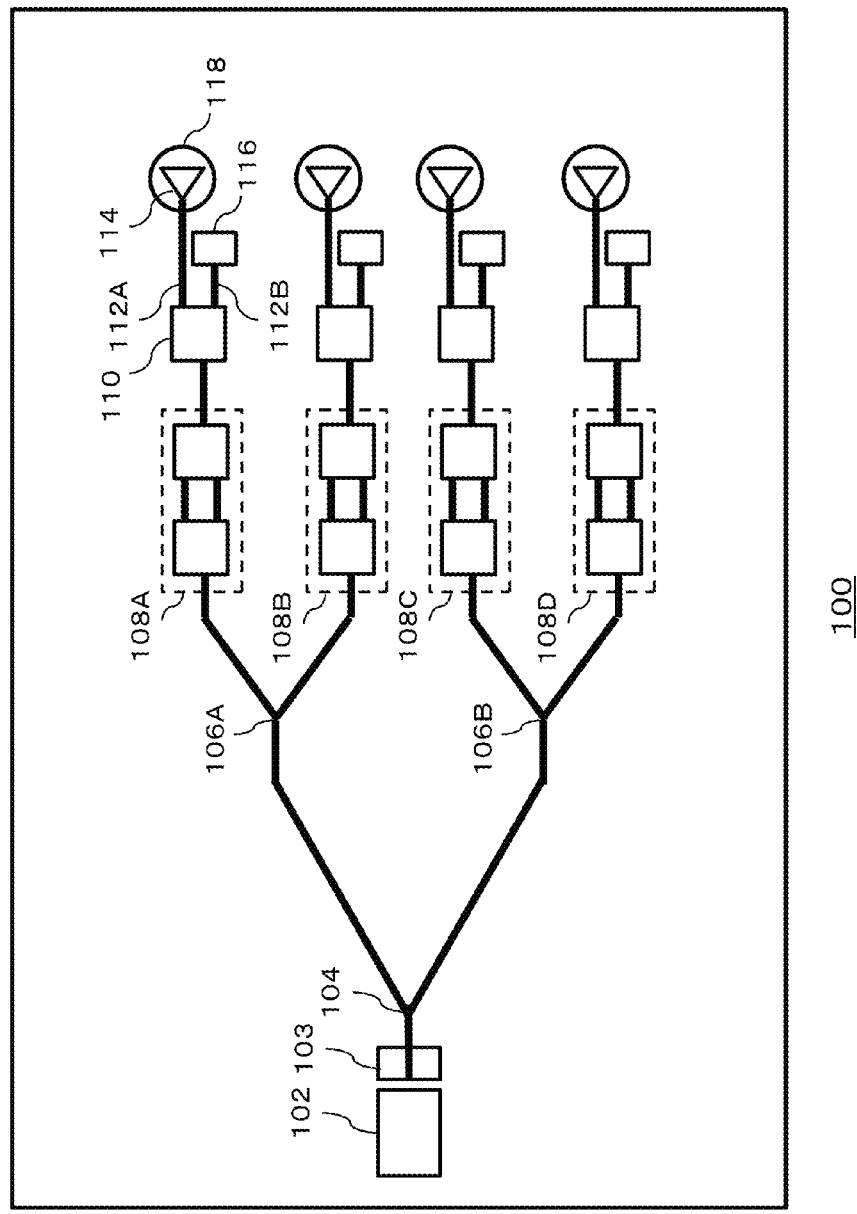
FIG. 1 is a drawing schematically showing an optical circuit according to an embodiment of the present invention.

Embodiments of the present invention will be explained with reference to the drawings. FIG. 1 schematically shows an optical circuit 100 according to an embodiment of the present invention. The optical circuit 100 comprises a light source 102, optical branching parts 104, 106A, and 106B, and optical modulators 108A, 108B, 108C, and 108D. The light source 102 may comprise a semiconductor laser. The light emitted from the light source 102 is branched off to two waveguides at the optical branching part 104; further branched off to four waveguides at the optical branching parts 106A and 106B; and inputted to the optical modulators 108A, 108B, 108C, and 108D. Although the light from the optical source 102 is branched off to four optical waveguides in the present embodiment, the light from the optical source may be guided to one optical waveguide, or branched off to any number of optical waveguides. The optical modulators 108A, 108B, 108C, and 108D may be Mach-Zehnder interferometers or other types of external optical modulators. Note that, although the light emitted from the light source 102 is coupled to the waveguide by use of a spot size converter 103 in FIG. 1, another method may be used for it.

In the following, a construction of an optical circuit, that is connected to an output of the optical modulator 108A, will be explained specifically. In this regard, an optical circuit similar to that connected to the optical modulator 108A may be connected to each of the optical modulators 108B, 108C, and 108D. The optical circuit 100 is constructed in such a manner that it comprises an optical branching part 110 coupled to the optical modulator 108A, and the light outputted from the optical modulator 108A is intentionally branched off. The optical branching part 110 may be a multimode interference (MMI) optical coupler. The optical modulator 108A is coupled to optical waveguides 112A and 112B via the optical branching part 110. The optical waveguide 112A is connected to an optical coupler 114 and the optical waveguide 112B is connected to an optical reflection part 116. The optical coupler 114 may be a grating coupler or any other optical coupler. The optical coupler 114 is constructed to couple the light propagated through the optical waveguide 112A via the optical branching part 110 to an optical waveguide 118 for transmitting the light. The optical waveguide 118 may be an optical fiber or any other optical waveguide. In the embodiment shown in FIG. 1, a grating coupler is used as the optical coupler 114, and an optical fiber is use as the optical waveguide 118. FIG. 1 shows a cross section of the optical fiber 118, and schematically shows that the optical circuit 100 is constructed to couple the diffracted light from the grating coupler 114 to the optical fiber 118.

Figure 2:
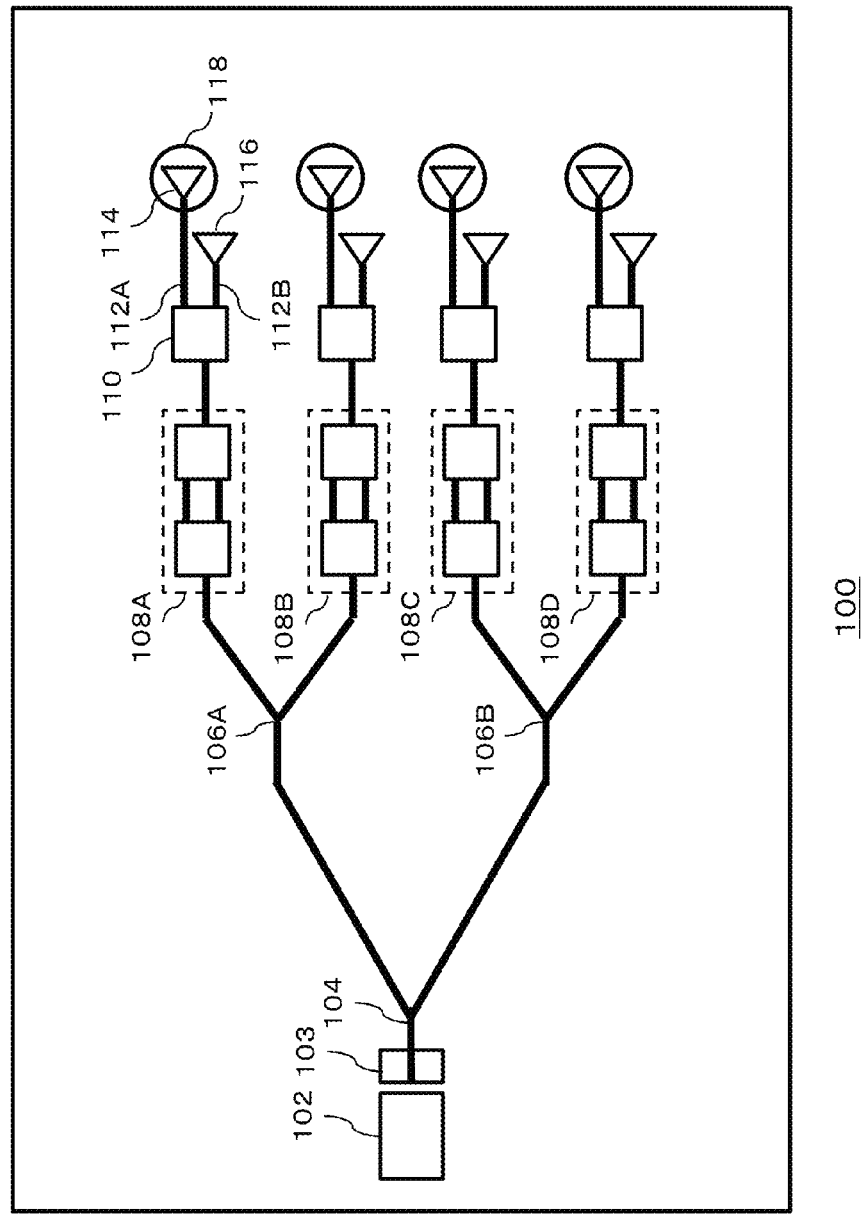
FIG. 2 is a drawing schematically showing an optical circuit according to an embodiment of the present invention.

In view of reduction of dispersion of production, it is preferable that the optical reflection part 116 is made to be an optical element having a reflection characteristic that is substantially the same as that of the optical coupler 114. In addition, in view of reduction of dispersion of production and maximal suppression of returning light, it is preferable that the light is branched off equally to two waveguides at the optical branching part 110. For example, the optical reflection part 116 may be constructed to provide a reflection spectrum and a reflection coefficient substantially identical with those of the optical coupler 114. In this construction, the spectrum and the power of the light reflected from the optical reflection part 116 are substantially equivalent to those of the light returned from the optical coupler 114. However, if the reflection coefficient is designable, it is possible that the optical reflection part 116 may comprise a grating coupler or any other type of optical coupler, or another optical element such as an optical power monitor. In the case that the optical reflection part 116 is an optical coupler, the light transmitted through the optical reflection part 116 may be terminated. In the case that the optical reflection part 116 is an optical monitor, the spectrum, the power, and so on of the light transmitted through the optical reflection part 116 can be measured. In the case that the absolute value of the reflection coefficient of the designed optical reflection part is different from that of the optical coupler 114, the returning optical power may be adjusted by changing the ratio of branching of the optical branching part 110 by design. FIG. 2 shows an embodiment of the optical circuit 100 in which a grating coupler is used as the optical reflection part 116.

The optical elements that form the optical circuit 100 may be formed on a same substrate. For example, in an embodiment, the optical circuit 100 may be formed by integrating Si waveguides, optical elements, etc., on a silica glass ($SiO_2$) layer deposited on a silicon (Si) substrate, by use of a silicon photonics technique. In this case, the optical coupler 114 is constructed as a grating coupler, for example; and the entering light is diffracted, for example, toward the upper side with respect to the substrate, to couple the light to the optical waveguide 118. The optical coupler 114 is constructed to output light having a spot size that makes the optical coupling efficiency with the optical waveguide 118 to be sufficiently high. For example, in the case that the optical coupler 114 is a grating coupler and the optical waveguide 118 is a single-mode optical fiber having a core diameter of 10 μm, the grating coupler may be constructed as shown in FIG. 3.

Figure 3:
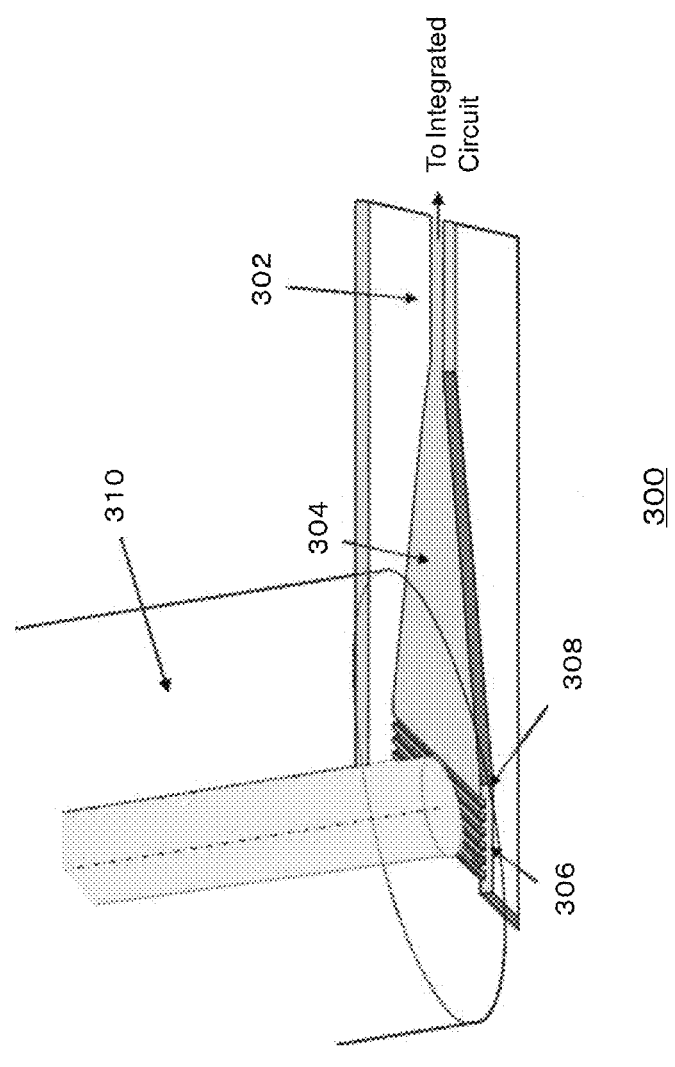
FIG. 3 is a drawing showing an example of optical coupling between an optical coupler and an optical waveguide according to an embodiment of the present invention.

FIG. 3 shows an example of optical coupling between an optical coupler and an optical waveguide according to an embodiment of the present invention. In this example, the grating coupler 300 comprises a Si narrow line 302, a tapered waveguide 304 connected to the Si narrow line 302, and a wide-width waveguide 308 connected to the tapered waveguide 304 and comprising grating 306 formed thereon.

In the embodiment, the wavelength of the signal light may be in a 1.55 μm band or a 1.31 μm band. In an embodiment in which propagation and transmission of an optical signal in the 1.31 μm band is carried out, the core of the Si narrow line 302 has a thickness of 60 nm and a width of 500 nm, for example. The tapered waveguide 304 has a length of 700 μm, for example, and an expanding width expanding from 500 nm to 10 μm, for example, for connecting it to the wide-width waveguide 308. The grating 306 has a period of 635 nm and a duty cycle of 50%, for example. The grating 306 may be constructed to have a thickness of 120 nm and an etched depth of 60 nm, for example. In this example, the optical signal, that is inputted from the Si narrow line 302 and has a wavelength in the 1.31 μm band, is widened to have a spot size having a width of approximately 10 μm by the tapered waveguide 304; diffracted by the grating 306; and coupled to the single-mode optical fiber 310. According to such an embodiment of the present invention, it becomes possible to couple the optical signal to the single-mode optical fiber 310, as explained above.

When a part of the light outputted from the optical modulator 108A is coupled to the optical waveguide 118 via the optical coupler 114, the part of the light is reflected by the optical coupler 114. If the reflected light returns to the light source 104 via the modulator 108A, optical branching part 106A, and the optical branching part 104, the operation of the light source becomes unstable. For solving the above problem, in the present embodiment, the light outputted from the optical modulator 108A is intentionally branched off to two optical waveguides 112A and 112B at the optical branching part 110, instead of guiding the light to a single optical coupler 114. The optical waveguide 112A is connected to the optical coupler 114, and the optical waveguide 112B is connected to the optical reflection part 116.

The optical waveguides 112A and 112B, the optical coupler 114, and the optical reflection part 116 are constructed in such a manner that a phase difference between the phase of the light reflected from the optical coupler 114 and returned via the optical waveguide 112A to the optical branching part 110 and the phase of the light reflected from the optical reflection part 116 and returned via the optical waveguide 112B to the optical branching part 110 becomes (2m−1)π (m is an integer) at the light source side of the optical branching part 110. Preferably, m=1 or m=0.

For achieving the above object, for example, the optical circuit 100 is constructed in such a manner that, in the optical branching part 110, the phase shift of light propagating from the modulator-side waveguide to the optical waveguide 112A and the phase shift of light propagating from the modulator-side waveguide to the optical waveguide 112B are made to be equal with each other; the reflection coefficient of the optical coupler 114 and that of the optical reflection part 116 are made to be the same; and the difference between the round-trip optical path length of the optical waveguide 112A and the round-trip optical path length of the optical waveguide 112B is set to be (m−1/2)λ (m is an integer, and λ is a wavelength of the light emitted from the light source 102). In this case, the optical waveguides 112A and 112B are constructed in such a manner that the difference between the one-way optical path lengths of them is set to be ((m−1/2)λ)/2. In particular, since the optical circuit 100 of the present embodiment reduces the returned light of the optical signal modulated by the optical modulator 108A, it is preferable that the shift between the optical signal reflected by the optical coupler 114 and the optical signal reflected by the optical reflection part 116, at the optical branching part 110, is equal to or less than one hundredth bit, for example. To realize this, it is desirable that the difference between the lengths of the optical waveguides 112A and 112B is equal to or less than one hundredth of (c/ng)×(1/k) (unit thereof is meter (m)). In the above, ng is a group refractive index of the optical waveguide 112A and the optical waveguide 112B, c (m/s) is the velocity of light, and k (bps) is a transmission rate of a signal.

Also, the optical circuit 100 may be constructed in such a manner that, for making the phase difference between the phase of the light reflected by the optical coupler 114 and returned to the optical branching part 110 and the phase of the light reflected by the optical reflection part 116 and returned to the optical branching part 110 to be (2m−1)π at the optical branching part 110, the phase shift of light propagating from the modulator-side waveguide to the optical waveguide 112A and the phase shift of light propagating from the modulator-side waveguide to the optical waveguide 112B, in the optical branching part 110, are made to be equal with each other; the optical waveguides 112A and 112B have optical path lengths different from each other; and the optical coupler 114 and the optical reflection part 116 have reflection coefficients different from each other. For example, the optical circuit 100 may be constructed in such a manner that the difference between the phase of the reflection coefficient of the optical coupler 114 and the phase of the reflection coefficient of the optical reflection part 116 is made to be ϕ; and the difference between the one-way optical path length between the optical branching part 110 and the optical coupler 114 and the one-way optical path length between the optical branching part 110 and the optical reflection part 116 is made to be ((m−1/2)−ϕ/π/2)λ/2, wherein m is an integer and λ is a wavelength of light.

For making, in the optical branching part 110, the phase shift of light propagating from the modulator-side waveguide to the optical waveguide 112A and the phase shift of light propagating from the modulator-side waveguide to the optical waveguide 112B to be equal with each other, a 1×2 multimode interference (MMI) optical coupler shown in the optical circuit 100 is used, for example. In the optical branching part such as that used in each of the optical circuits 400 and 500 that will explained later, it is possible to use a 2×2 multimode interference (MMI) optical coupler instead of the 1×2 MMI. In such a case, the difference between the phase shift of light propagating from the modulator-side waveguide to the optical waveguide 112A and the phase shift of light propagating from the modulator-side waveguide to the optical waveguide 112B, in the optical branching part 110, will be π/2. Thus, for example, it may be constructed in such a manner that the difference between the phase of the reflection coefficient of the optical coupler 114 and the phase of the reflection coefficient of the optical reflection part 116 is ϕ; and the difference between the optical path length between the optical branching part 110 and the optical coupler 114 and the optical path length between the optical branching part 110 and the optical reflection part 116 is (m−ϕ/π/2)λ/2, wherein m is an integer, and λ is the wavelength of an optical signal. In this case, the phase difference between the phase of the reflected light from the optical coupler and the phase of the reflected light from the optical reflection part, at the port of the light-source side of the branching part to which the light from the light source is inputted, is also (2m−1)π (m is an integer). When dispersion of production is taken into consideration, it is preferable to use a 1×2 multimode interference (MMI) optical coupler rather than a 2×2 multimode interference (MMI) optical coupler.

For example, in the case that grating couplers are used as the optical coupler 114 and the optical reflection part 116, the phases of the reflection coefficients of them can be adjusted by changing pitches of the gratings in respective grating couplers. If it is supposed that the propagation coefficient of light is β, the pitch of the grating is Λ, K=2π/Λ, and detuning is defined by δ=β−K, the reflection coefficient r in the case of a grating having uniform pitch can be represented as follows.

[Formula 1]

$$r \propto \frac{-j\kappa \tanh(\sigma L)}{\sigma + j\delta \tanh(\sigma L)} \quad \text{(Formula 1)}$$

In the above formula, j is the imaginary unit, κ is a coupling constant, $\sigma^2 = \kappa^2 - \delta^2$, and L is the length of the grating.

The optical circuit 100 may be constructed with the intention such that, although the angle of the light radiated from the grating of the optical coupler 114 with respect to the waveguide substrate and the angle of the light radiated from the grating of the optical reflection part 116 with respect to the waveguide substrate are different from each other, absolute values of the reflection coefficients returning to the optical branching part 110 become the same. By this construction, the optical circuit 100 can clearly separate the light radiated from the grating of the optical coupler 114 and the light radiated from the grating of the optical reflection part 116, and suppress crosstalk of stray light. In this example, regarding the reflection coefficient of the optical coupler 114 and the reflection coefficient of the optical reflection part 116 that may be represented by Formula 1, the absolute values thereof are substantially the same, although the phases of the reflection coefficients are different from each other. If it is supposed that the phase of the modulator-side waveguide extending until the optical waveguide 112A and the phase of the modulator-side waveguide extending until the optical waveguide 112B, in the optical branching part 110, are equal with each other, the absolute values of the reflection coefficients of the optical coupler 114 and the optical reflection part 116 are substantially the same, and the phase difference between the reflection coefficients is ϕ, then, the optical circuit 100 may be constructed in such a manner that the difference between the optical path length of the optical waveguide 112A and the optical path length of the optical waveguide 112B is made to be ((m−1/2)−ϕ/π/2)λ/2. According to this embodiment, in the construction that uses grating couplers as the optical coupler 114 and the optical reflection part 116, the optical circuit 100 that has a construction such that the angle of the light radiated from the optical coupler 114 with respect to the waveguide substrate and the angle of the light radiated from the optical reflection part 116 with respect to the waveguide substrate are different from each other, and such that the phase difference between the phase of the light reflected from the optical coupler 114 and returned via the optical waveguide 112A to the optical branching part 110 and the phase of the light reflected from the optical reflection part 116 and returned via the optical waveguide 112B to the optical branching part 110 becomes $(2m-1)\pi$ (m is an integer) at the optical branching part 110, can be realized.

Also, in an embodiment in which grating couplers are used as the optical coupler 114 and the optical reflection part 116, it may be constructed in such a manner that, in the optical branching part 110, the phase shift of light propagating from the modulator-side waveguide to the optical waveguide 112A and the phase shift of light propagating from the modulator-side waveguide to the optical waveguide 112B are made to be equal with each other; the optical path length of the optical waveguide 112A and the optical path length of the optical waveguide 112B are made to be equal with each other; and the phase of the light, that is reflected by the optical coupler 114, at the connection point between the optical waveguide 112A and the optical coupler 114 and the phase of the light, that is reflected by the optical reflection part 116, at the connection point between the optical waveguide 112B and the optical reflection part 116 are shifted by $(2m-1)\pi$ (m is an integer) with each other. Preferably, m=0 or m=1. For achieving the above object, the pitch Λ of each of gratings of the optical coupler 114 and the optical reflection part 116 may be set in such a manner that the phases of the reflection coefficients r represented by Formula 1 are made to be different by $(2m-1)\pi$ (m is an integer) between that of the grating of the optical coupler 114 and that of the grating of the optical reflection part 116. For example, regarding Formula 1, if "κ"s are set to be equal with each other, the grating pitches only are set to be different, and the phases of the reflection coefficients are shifted by n with each other, the formulas can be adjusted as follows.

[Formula 2]

$$\frac{-j\kappa\tanh(\sigma L)}{\sigma + j\delta_1\tanh(\sigma L)} \approx -\frac{-j\kappa\tanh(\sigma L)}{\sigma + j\delta_2\tanh(\sigma L)} \qquad \text{(Formula 2)}$$

Then, the following formula can be derived.

[Formula 3]

$$2\sigma + j(\delta_1 + \delta_2)\tan h(\sigma L) = 0 \qquad \text{(Formula 3)}$$

If it is supposed that κ and σ are real numbers, it results in that σ=0 and $\delta_1 = -\delta_2 = \kappa$. Generally, if Taylor expansion is applied to $e^x$, the result thereof will be as follows:

[Formula 4]

$$e^x = \sum_{n=0}^{\infty} \frac{x^n}{n!} \qquad \text{(Formula 4)}$$

In the case that x is sufficiently small, the following formula can be derived.

[Formula 5]

$$e^x = 1 + x + O(x^2) \qquad \text{(Formula 5)}$$

Thus, the following formula can be derived.

[Formula 6]

$$\tanh(x) = \frac{e^x - e^{-x}}{e^x + e^{-x}} \qquad \text{(Formula 6)}$$
$$= \frac{(1+x) - (1-x) + O(x^2)}{(1+x) + (1-x) + O(x^2)}$$
$$\approx x$$

According to Formula 6, the following formula can be derived if σL in Formula 1 is sufficiently small.

[Formula 7]

$$r \propto \frac{-j\kappa\sigma L}{\sigma + j\delta\sigma L} = \frac{-j\kappa}{1/L + j\delta} \qquad \text{(Formula 7)}$$

If L is sufficiently large when it is compared with 1/κ, the following formula can be derived based on Formula 7.

[Formula 8]

$$r \propto \frac{-\kappa}{\delta} \qquad \text{(Formula 8)}$$

That is, since σ=0 in the case that the grating pitch of the optical coupler 114 is determined to satisfy δ=κ and the grating pitch of the optical reflection part 116 is determined to satisfy δ=−κ, it results in
r∝−1 and
r∝1.

In other words, if the grating pitches are determined to satisfy the above relationships, the phases of the reflection coefficients become different by n with each other, and the absolute values of the reflectance become substantially the same. By constructing the optical coupler 114 and the optical reflection part 116 as explained above, the amplitude of the light reflected by the optical coupler 114 and that reflected by the optical reflection part 116 become substantially the same, and the difference between the phase of the light reflected by the optical coupler 114 and that of the light reflected by the optical reflection part 116 becomes n; thus, the reflected light from the optical coupler 114 and that from the optical reflection part 116 can be cancelled out in the optical branching part 110.

For increasing reproducibility of the optical circuit 100 while maintaining the effect such that the reflected light is cancelled out at the coupling part for coupling to the optical waveguide 118, it is desirable that the constructions of the optical coupler 114 and the optical reflection part 116 are the same for allowing them to be manufactured by use of the same manufacturing process. For example, as explained above, it is preferable to construct the optical coupler 114 and the optical reflection part 116 as grating couplers. In this regard, the above embodiment of the present invention also has an advantage. For example, in the case that a prior-art end-surface-emitting-type spot size conversion is used in the optical reflection part 116, the production error of the waveguide length will become large, since the end surface is made by carrying out cleaving and dicing processes. Thus, according to such a prior-art technique, control of the waveguide length, that corresponds to the optical path difference (for example, $\lambda/4$) required to be considered when producing the optical circuit 100, cannot be carried out. On the other hand, in the case that a grating coupler is used as the optical reflection part 116 like the embodiment of the present invention, precision of production of the optical circuit 100 will be increased since the optical reflection part 116 can be produced by use of an electron beam (EB). Further, in the case that the constructions of the grating couplers that constitute the optical coupler 114 and the optical reflection part 116 are completely the same, they are not required to be constructed to have uniform grating pitches.

In the embodiment of the present invention, the construction of the cross section of the optical waveguide 112A and that of the optical waveguide 112B may be the same.

In addition, the refractive index of the waveguide is changed due to the effect of temperature. In the embodiment of the present invention, in the optical circuit 100, it is desirable that the refractive index of the optical waveguide 112A and that of the optical waveguide 112B change similarly to correspond to the change in the ambient temperature. In the case that one waveguide only is affected by the change in temperature, the optical path length of the one waveguide only is changed; and, in the case that the optical path lengths are long, the phases in the two waveguides will be changed largely. The optical waveguide 112A and the optical waveguide 112B may be placed in such a manner that they are separated from each other for a distance that prevents them from being coupled with each other as a directional coupler, and that they are placed close enough with each other (in parallel, for example). Similarly, according to such an embodiment, the refractive indexes of the optical waveguide 112A and the optical waveguide 112B are changed similarly, due to the effect of heat generated by an IC, a semiconductor laser, and so on. Consequently, the effect of the change in temperature, that is to be influenced, depends on the difference between the length of the optical waveguide 112A and that of the optical waveguide 112B. For example, a case that the reflection coefficients of the optical coupler 114 and the optical reflection part 116 are the same and the absolute values and the phases of the reflection coefficients are also the same will be considered. It is supposed that the optical path length of the optical waveguide 112A is $L+((m-1/2)\lambda)/2$, and the optical path length of the optical waveguide 112B is L. Under the above condition, and due to the change in temperature, if the value of the refractive index is changed to a value equal to $(1+\alpha)$ times of the value of the refractive index, the optical path length of the optical waveguide 112A becomes $(1+\alpha)(L+((m-1/2)\lambda)/2)$, the optical path length of the optical waveguide 112B becomes $(1+\alpha)L$, and the length difference between the two optical paths becomes $(1+\alpha)((m-1/2)\lambda)/2$. If m is 1, the optical path length difference becomes $(1+\alpha)\lambda/4$. Since a is small, the difference between the round-trip optical paths becomes $(1+\alpha)\lambda/2\sim\lambda/2$, and the phase difference of phases of the round trips is kept as $\pi$. On the other hand, if the optical waveguide 112A only is affected by the change in temperature, the optical path length of the optical waveguide 112A becomes $(1+\alpha)(L+((m-1/2)\lambda)/2)$, the optical path length of the optical waveguide 112B becomes L, and the difference between the two optical path length becomes $\alpha L+(1+\alpha)((m-1/2)\lambda)/2$. If m=1, the value becomes $\alpha L+(1+\alpha)\lambda/4$, and the difference between the round-trip optical paths becomes $2\alpha L+(1+\alpha)\lambda/2$. Since L is large, even if a is small, the difference between the round-trip optical paths becomes $2\alpha L+\lambda/2$; and, thus, it is difficult to keep the phase difference between the phase of the round trip of waveguide 112A and the phase of the round trip of the waveguide 112B to be $\pi$. Thus, by arranging the optical waveguide 112A and the optical waveguide 112B in such a manner that they are separated from each other for a distance that prevents them from being coupled with each other as a directional coupler, but placed close enough with each other (in parallel, for example), it becomes easy to control in such a manner that the optical path difference between these waveguides is maintained near a desired phase difference. Although the phase difference between phases of the round trips of the waveguides is set to be $\pi$ in this case, the value to be set is not limited to this. It is desirable that the distance between the optical waveguide 112A and the optical waveguide 112B is set to be equal to or less than 50 μm.

Also, it may be possible to intentionally construct the optical waveguide 112A and the optical waveguide 112B in such a manner that the constructions of the cross sections of them are different so as to generate a desired phase difference. For example, the optical waveguide 112A and the optical waveguide 112B may be constructed in such a manner that their length are the same and their effective refractive indexes are different. In an embodiment, the optical waveguide 112A and the optical waveguide 112B may be constructed in such a manner that the refractive indexes of the cores and the clads are made to be different, the diameters of the cores are made to be different, or the like, for setting the phase difference between the phase of the light returned via the optical waveguide 112A to the optical branching part 110 and the phase of the light returned via the optical waveguide 112B to the optical branching part 110, at the optical branching part 110, to be $(2m-1)\pi$ (m is an integer).

Figure 4:
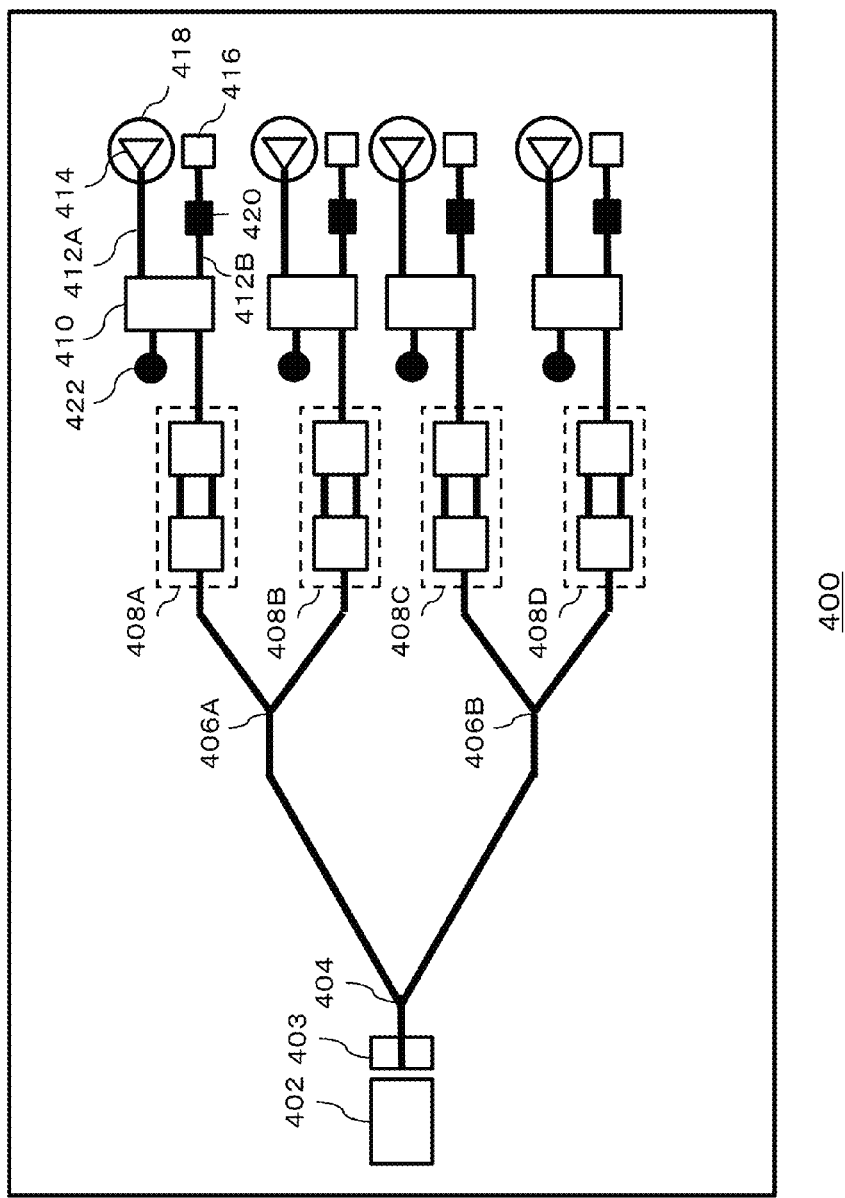
FIG. 4 is a drawing schematically showing an optical circuit according to an embodiment of the present invention.

FIG. 4 shows an optical circuit 400 according to another embodiment of the present invention. Similar to the optical circuit 100 shown in FIG. 1, the optical circuit 400 comprises a light source 402, optical branching parts 404, 406A, and 406B, optical modulators 408A, 408B, 408C, and 408D, an optical branching part 410, optical waveguides 412A and 412B, an optical coupler 414, and an optical reflection part 416. The optical coupler 414 is constructed to couple light propagated through the optical waveguide 412 via the optical branching part 410 to the optical waveguide 418 for transmitting the light. The optical branching part 410 is constructed as a coupler having at least two inputs and at least two outputs (for example, a 2×2 coupler). The optical circuit 400 further comprises an optical phase adjusting part 420 on the optical waveguide 412B. A first input of the two input of the optical branching part 410 is connected to the optical modulator 408A, and a second input is connected to the optical detector 422 comprising a photodiode or the like.

The optical phase adjusting part 420 may be constructed to have a MOS structure, a PN structure, or the like, or constructed as a heater or the like. In the case of the MOS structure, the phase of the light propagating through the optical waveguide 412B is adjusted by applying a voltage to the optical phase adjusting part 420. In the case of the PN structure, current is inputted to the optical phase adjusting part 420; and, in the case of the heater, optical phase adjusting part 420 is heated.

According to the embodiment of FIG. 4, among the optical power returned from the optical coupler 414 and the optical reflection part 416 to the optical branching part 410, the optical power returned to the second input of the optical branching part 410 is monitored by the optical detector 422. When the optical power to be detected by the optical detector 422 becomes maximum, the optical power returned from the first input of the optical branching part 410 to the optical modulator 408A becomes minimum. At that time, the phase difference between the phase of the light reflected by the optical coupler 414 and returned to the first input of the optical branching part 410 and the phase of the light reflected by the optical reflection part 416 and returned to the first input of the optical branching part 410 is $(2m-1)\pi$ (m is an integer). Thus, according to the embodiment, the operation of the light source 402 can be stabilized by controlling the optical phase adjusting part 420 in such a manner that the optical power to be detected by the optical detector 422 is made to be maximum. According to the construction shown in FIG. 4, even if dispersion of production in terms of length of the optical waveguides 412A and 412B exists, the optical power returning to the optical modulator 408A can be minimized, and the operation of the light source 402 can be stabilized. Further, in this embodiment, since the optical phase adjusting part 420 and the optical detector 422 can be manufactured by use of a process that is the same as that for manufacturing other optical elements, it is not required to add any manufacturing processes.

Figure 5:
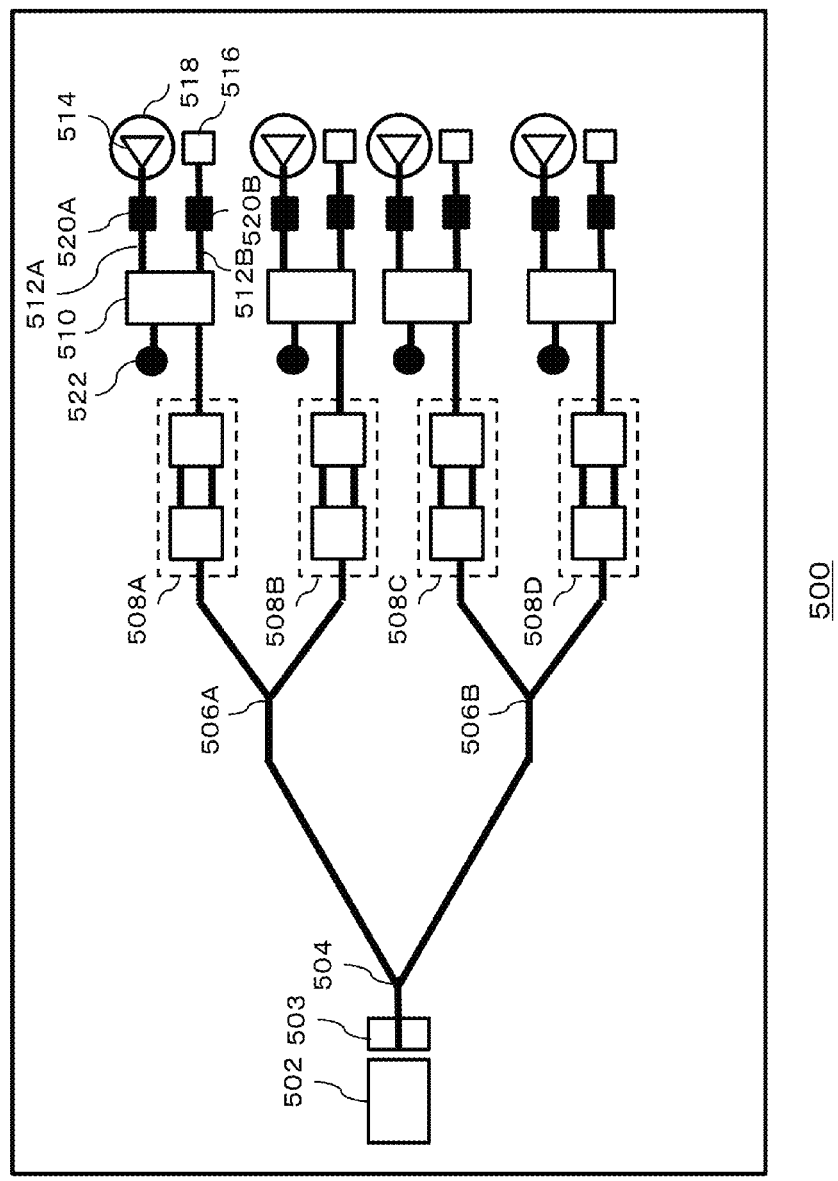
FIG. 5 is a drawing schematically showing an optical circuit according to an embodiment of the present invention.

FIG. 5 shows an optical circuit 500 according to another embodiment of the present invention. The optical circuit 500 comprises a construction similar to that of the optical circuit 400, and additionally comprises an optical phase adjusting part 520A on the optical waveguide 512A. The optical phase adjusting part 520A is constructed in such a manner that it has an optical loss equivalent to that of the optical phase adjusting part 520B. In the operation of the optical circuit 500, the optical phase adjusting part 520B is controlled in such a manner that the optical power to be detected by the optical detector 522 is made to be maximum; and, on the other hand, the optical phase adjusting part 520A is not driven. According to the construction shown in FIG. 5, since the optical loss of the optical waveguide 512A is equivalent to the optical loss of the optical waveguide 512B, the optical power reflected by the optical coupler 514 and returned to the optical branching part 510 and the optical power reflected by the optical reflection part 510 and returned to the optical branching part 510 become approximately equal with each other. Thus, the optical power returning from the optical branching part 510 to the optical modulator 508A can be substantially suppressed, by controlling the optical phase adjusting part 520B in such a manner that the light detected by the optical detector 522 becomes maximum.

Similar to the embodiment shown in FIG. 2, in the embodiments shown in FIGS. 4 and 5, in view of suppression of dispersion of production, it is preferable to use optical couplers similar to the optical couplers 414 and 514 as the optical reflection parts 416 and 516. In addition, in view of suppression of dispersion of production and maximal suppression of returning light, it is preferable that the light from the modulator is branched off equally to two waveguides coupled to the optical couplers. However, in the case that the absolute values of the designed reflection coefficients of the optical reflection parts 416 and 516 are different from those of the optical couplers 414 and 514, the returning optical power may be adjusted by changing the ratio of branching of the optical branching part by design.

Figure 6:
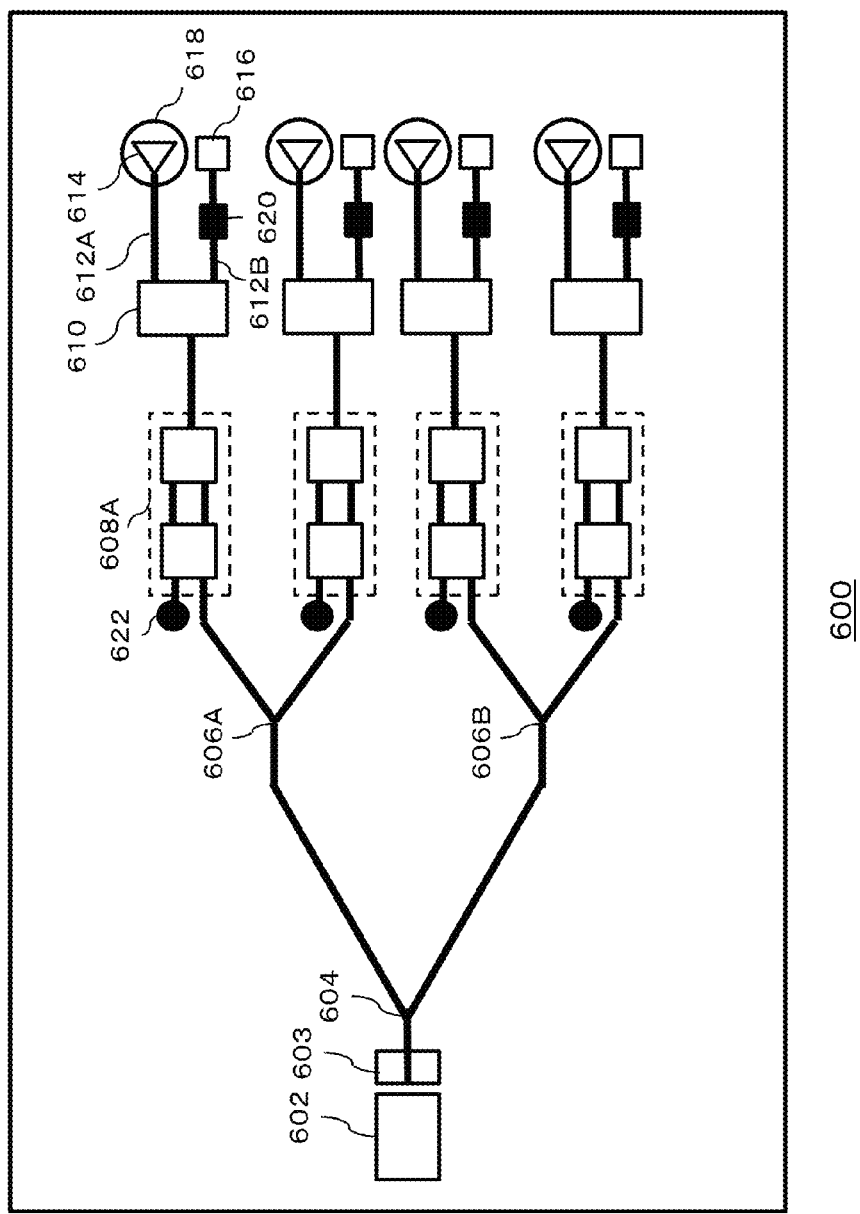
FIG. 6 is a drawing schematically showing an optical circuit according to an embodiment of the present invention.

FIG. 6 shows an optical circuit 600 according to another embodiment of the present invention. This is a modified version of the optical circuit 400 of FIG. 4. In the optical circuit 600, an optical coupling part 610 comprises an input; and an optical detector 622 is connected to one of inputs of an optical modulator 608A instead of the input of the optical branching part 610. The optical circuit 600 can stabilize the operation of a light source 602 by controlling an optical phase adjusting part 620 in such a manner that the optical power to be detected by the optical detector 622 is made to be minimum. The condition of driving of the optical phase adjusting part 620 that results in minimization of the optical power at the optical detector 622 (for example, an applied voltage, in the case that the optical phase adjusting part 620 comprises a MOS structure) may be directly determined. In addition, it may be possible to determine one driving condition of the optical phase adjusting part 620 that maximizes the optical power at the optical detector 622, and determine another driving condition of the optical phase adjusting part 620 that provides a next large optical power, and drive the optical phase adjusting part 620 by using a value of a driving condition between those of the above two driving condition.

Note that it may be possible to construct the optical circuit 500 shown in FIG. 5 in such a manner that the optical detector 522 is connected to one of inputs of the optical modulator 508A in a manner similar to that of FIG. 6. Further, in the optical circuit 600 shown in FIG. 6, it may be possible to provide another optical phase adjusting part on the waveguide 612A, in a manner similar to that shown in FIG. 5.

By constructing the optical circuit as explained above, reflected light, that appears when light from an optical modulator is coupled to an optical waveguide by an optical coupler for transmitting the light, can be cancelled out. Thus, according to the embodiments, instability of the operation of the light source can be lessened. Further, according to the embodiments, since it is not required to place an expensive optical isolator on an output end of a light source, an optical circuit can be manufactured at low cost. In the case that a silicon photonics technique is used to form an optical circuit on a SOI (Silicon On Insulator) substrate, an optical circuit having the above characteristics can be highly integrated on the substrate by use of silicon processes; thus, the optical circuit can be downsized, the manufacturing process can be simplified, and the manufacturing cost can be reduced.

Figure 7:
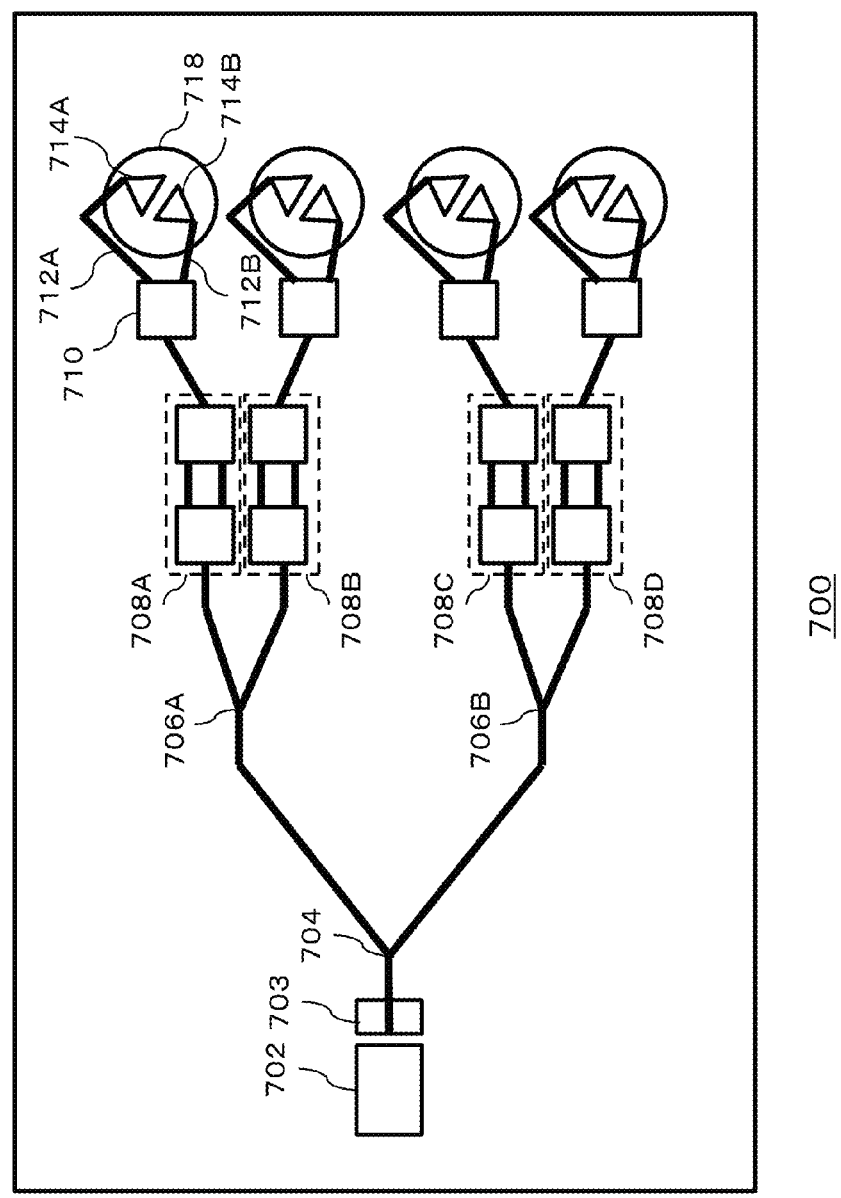
FIG. 7 is a drawing schematically showing an optical circuit according to an embodiment of the present invention.

FIG. 7 shows an optical circuit 700 according to another embodiment of the present invention that can lessen instability of an operation of a light source due to reflected light occurred in an optical circuit located after an optical modulator. The optical circuit 700 may be formed by integrating optical elements on a SOI substrate by use of a silicon photonics technique. In the following, a construction of an optical circuit connected to an output of an optical modulator 708A will be specifically explained; and, in this regard, an optical circuit similar to the above optical circuit may be connected to each of optical modulators 708B, 708C, and 708D.

The optical circuit 700 is constructed to make the light outputted from an optical modulator 708A to be branched to two optical waveguides 712A and 712B via an optical branching part 710. The optical waveguides 712A and 712B are connected to optical couplers 714A and 714B, respectively. FIG. 7 shows an example in which grating couplers are used as optical couplers 714A and 714B. The grating coupler comprises an Si narrow line, a tapered waveguide connected to the Si narrow line, and a wide-width waveguide connected to the tapered waveguide and having grating formed thereon. In an embodiment in which the wavelength of the signal light is in a 1.31 μm band, the core of the Si narrow line has a thickness of 60 nm and a width of 500 nm, for example. The tapered waveguide has a length of 700 μm and an expanding width expanding from 500 nm to 10 μm, for example, for connecting it to the wide-width waveguide. The grating has a period of 635 nm and a duty cycle of 50%, for example. The grating may be constructed to have a thickness of 120 nm and an etched depth of 6 nm, for example. In this example, the optical signal, that is inputted from the Si narrow line, is widened to have a spot size having a width of approximately 10 μm by the tapered waveguide; diffracted by the grating (toward upward, for example); and coupled to an optical waveguide that comprises an optical fiber or the like.

Figure 12:
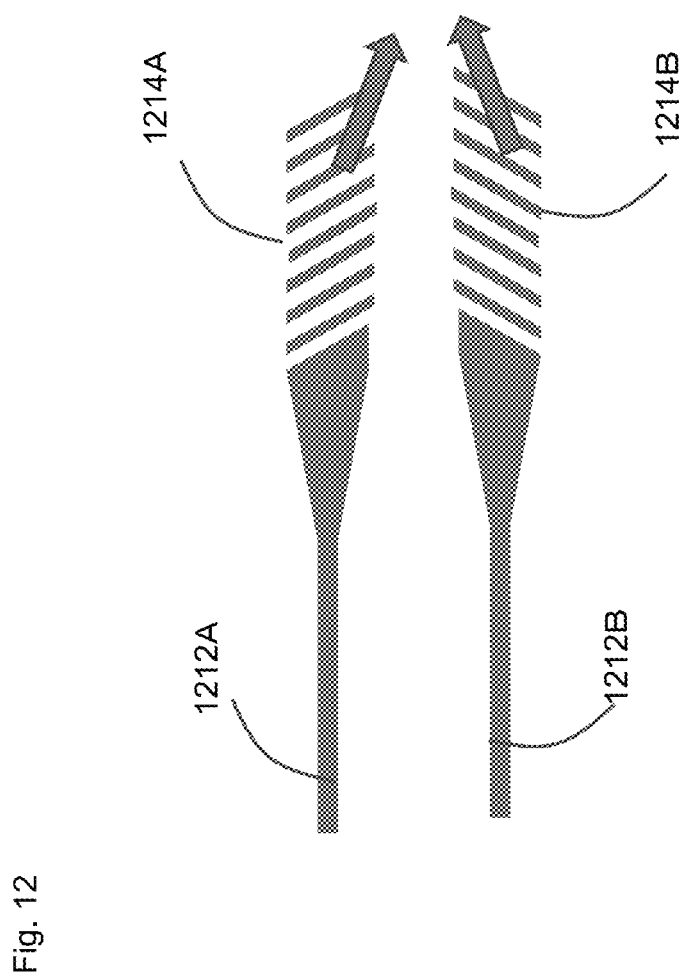
FIG. 12 is a drawing schematically showing examples of gratings formed on grating couplers of an optical circuit according to an embodiment of the present invention.

In this embodiment, each of the grating couplers 714A and 714B is constructed to diffract part of the light that has been made to be branched by the optical branching part 710, to couple the part of the light to an optical waveguide 718 for transmission. In FIG. 7, although the two grating couplers 714A and 714B are arranged to face with each other, arrangement of them is not limited to that shown in FIG. 7. The grating couplers may be placed in parallel with each other, like the arrangement shown in FIG. 2. It is preferable that the two grating couplers 714A and 714B are closely placed with each other to be able to be coupled to the optical waveguide 718. The optical circuit 700 may be constructed with the intention such that, although the angle of the light radiated from the grating of the grating coupler 714A with respect to the waveguide substrate and the angle of the light radiated from the grating of the grating coupler 714B with respect to the waveguide substrate are different from each other, absolute values of the reflection coefficients returning to the optical branching part 710 become the same. For example, if the grating is formed to be slanted with respect to the optical waveguide as shown in FIG. 12, the light is diffracted with respect to the slanted grating. The light can be concentrated by arranging the grating couplers in parallel with each other and setting the diffraction angles of the two grating couplers 1214A and 1214B to have the same value but to be oppositely oriented with each other; and coupling from two separated grating couplers to one waveguide becomes easy. The optical waveguide 718 may comprise an optical fiber. The optical waveguides 712A and 712B and the grating couplers 714A and 714B are constructed in such a manner that the difference between the phase of the light reflected by the grating coupler 714A and returned via the optical waveguide 712A to the optical branching part 710 and the phase of the light reflected by the grating coupler 714B and returned via the optical waveguide 712B to the optical branching part 710 becomes $(2m-1)\pi$ (m is an integer) at the light-source side of the optical branching part 710. Preferably, m=1 or m=0. By setting, for the two grating couplers, the angles of the gratings with respect to the waveguides to be the same, and by setting the magnitudes of the diffraction angles to be the same, it becomes possible to make the two grating couplers to have the same reflection coefficient, and to achieve maximal suppression of the returning light.

For this purpose, for example, in the case that the reflection coefficients of the grating couplers 714A and 714B are the same, it may be possible to construct in such a manner that the phase shift of light propagating from the modulator-side waveguide to the optical waveguide 712A and the phase shift of light propagating from the modulator-side waveguide to the optical waveguide 712B, in the branching part 710, are made to be equal with each other, and the difference between the round-trip optical path length of the optical waveguide 712A and the round-trip optical path length of the optical waveguide 712B is set to be $(m-1/2)\lambda$ (m is an integer, and λ is a wavelength of the light emitted from the light source 402). In this case, the optical waveguides 712A and 712B are constructed in such a manner that the difference between the one-way optical path lengths of them is set to be $((m-1/2)\lambda)/2$. In particular, since the present invention reduces the returning light of the optical signal modulated by the optical modulator 708A, it is preferable that the shift between the optical signal reflected by the grating coupler 714 and the optical signal reflected by the grating coupler 716, at the optical branching part 710, is equal to or less than one hundredth bit, for example. For realizing this, it is desirable that the difference between the lengths of the optical waveguides 712A and 712B is equal to or less than one hundredth of $(c/ng) \times (1/k)$ (unit thereof is meter (m)). In the above, ng is a group refractive index of the optical waveguides 712A and 712B, c (m/s) is the velocity of light, and k (bps) is a transmission rate of a signal.

Also, the optical circuit 700 may be constructed in such a manner that the optical path lengths of the optical waveguide 712A and 712B are made to be different and the reflection coefficients of the grating couplers 714A and 714B are made to be different for setting the phase difference between the phase of light reflected from the grating coupler 714A and returned to the optical branching part 710 and the phase of the light reflected from the grating coupler 714B and returned to the optical branching part 710 to be $(2m-1)\pi$. For example, the optical circuit 700 may be constructed by use of a 1×2 MMI in such a manner that the phase shift of light propagating from the modulator-side waveguide to the optical waveguide 712A and the phase shift of light propagating from the modulator-side waveguide to the optical waveguide 712B, in the branching part 710, are set to be equal with each other, and the difference between the phase of the reflection coefficient of the grating coupler 714A and the phase of the reflection coefficient of the grating coupler 714B is set to be ϕ; and that the difference between the optical path length between the optical branching part 710 and the grating coupler 714A and the optical path length between the optical branching part 710 and the grating coupler 714B is set to be $((m-1/2)-\phi/\pi/2)\lambda/2$, wherein m is an integer, and λ is a wavelength of the optical signal.

For the optical branching parts that are used in the optical circuits 800 and 900 that will explained later, it is possible to use a 2×2 multimode interference (MMI) optical coupler instead of the 1×2 MMI. In such a case, the difference between the phase of the modulator-side waveguide extending until the optical waveguide 712A and the phase of the modulator-side waveguide extending until the optical waveguide 712B will be π/2. Thus, for example, it may be constructed in such a manner that the difference between the phase of the reflection coefficient of the grating coupler 714A and the phase of the reflection coefficient of the grating coupler 714B is set to be ϕ; and that the difference between the one-way optical path length between the optical branching part 710 and the grating coupler 714A and the one-way optical path length between the optical branching part 710 and the grating coupler 714B is set to be $(m-\phi/\pi/2)\lambda/2$, wherein m is an integer, and A is the wavelength of light. In this case, the difference between the phase of the reflected light from the grating coupler 714A and the phase of the reflected light from the grating coupler 714B, at the port of the light-source side of the branching part to which the light from the light source is inputted, is also $(2m-1)\pi$ (m is an integer). When dispersion of production is taken into consideration, it is preferable to use a 1×2 multimode interference (MMI) optical coupler rather than a 2×2 multimode interference (MMI) optical coupler. In the case that the absolute values of the reflection coefficients of the optical couplers 714A and 714B are different from each other, the returning optical power may be adjusted by changing the ratio of branching of the optical branching part, by design.

Figure 13:
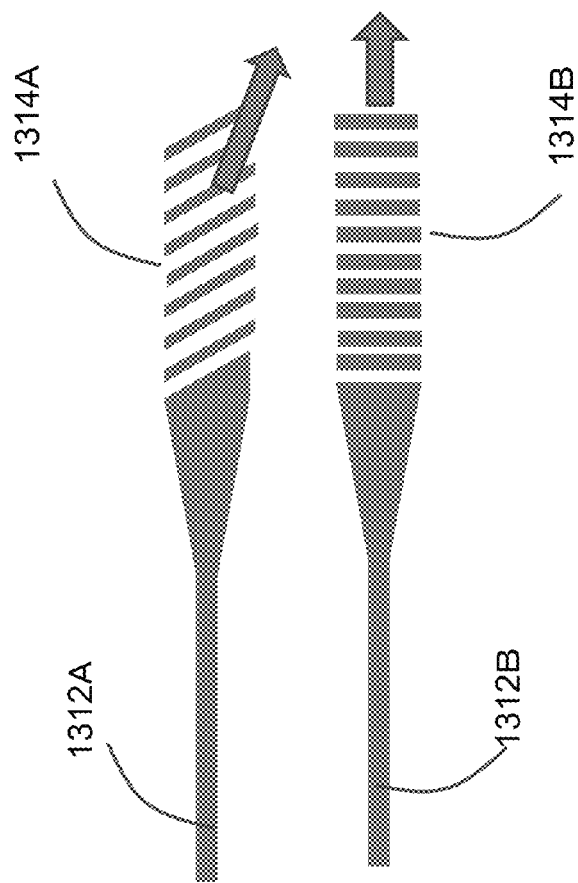
FIG. 13 is a drawing schematically showing examples of gratings formed on grating couplers of an optical circuit according to an embodiment of the present invention.

As shown in FIG. 13, it is also possible to place gratings in such a manner that one grating is formed to be slanted with respect to the waveguide; another grating coupler is formed to be orthogonal to the optical waveguide in a usual manner. By arranging the grating couplers in parallel with each other, the light can be concentrated since the light from the grating coupler 1314A is diffracted and the diffracted light approaches the light from the grating coupler 1314B; thus, it becomes easy to couple two separated grating couplers into one waveguide. In this example, if it is supposed that a 1×2 multimode interference (MMI) optical coupler is used and that the difference of phases of the reflection coefficients is ϕ, the optical circuit 700 can be constructed in such a manner that the difference between the optical path length of the optical wave guide 712A and the optical path length of the optical wave guide 712B is set to be $((m-1/2)\phi\phi/\pi/2)\lambda/2$. According to this embodiment, the optical circuit 700 comprising the constructions such that the angle of the light radiated from the grating coupler 714A with respect to the waveguide substrate and the angle of the light radiated from the grating coupler 714B with respect to the waveguide substrate are different from each other, and such that the difference between the phase of the light reflected from the grating coupler 714A and returned via the optical waveguide 712A to the optical branching part 710 and the phase of the light reflected from the grating coupler 714B and returned via the optical waveguide 712B to the optical branching part 710 becomes $(2m-1)\pi$ (m is an integer) at the optical branching part 710, can be realized. In view of suppression of dispersion of production, it is preferable that the ratio of branching at the optical branching part is set to be 1:1. It is possible to design the reflection coefficient of the grating coupler 714A and the reflection coefficient of the grating coupler 714B in such a manner that the absolute values of reflection coefficients are set to be approximately equal with each other, although the phases of the reflection coefficients are different from each other, by adjusting the pitch, the depth, the length L, the coupling constant κ, the duty ratio of each of the gratings. By setting the absolute values to be approximately equal with each other, the returning light can be reduced. Also, in the case that the absolute value of the reflection coefficient of the coupler 714A and that of the coupler 714B are different from each other, the returning optical power may be adjusted by changing the ratio of branching at the optical branching part, by design. The returning light can be suppressed by coupling the same optical power, with the phase difference of n, to the same waveguide.

Further, it may be possible to construct the optical circuit shown in FIG. 7 in such a manner that the phase shift of light propagating from the modulator-side waveguide to the optical waveguide 712A and the phase shift of light from the modulator-side waveguide to the optical waveguide 712B, in the branching part 710, are made to be equal with each other, and the optical path length of the optical waveguide 712A and the optical path length of the optical waveguide 712B are set to be equal with each other; and that the phase of the light, that is reflected by the grating coupler 714A, at the connection point between the optical waveguide 712A and the grating coupler 714A and the phase of the light, that is reflected by the grating coupler 714B, at the connection point between the optical waveguide 712B and the grating coupler 714B are shifted by $(2m-1)\pi$ (m is an integer) with each other. For achieving the above object, the pitch Λ of each of gratings of the grating couplers may be set in such a manner that the phase of the reflection coefficient r represented by Formula 1 is made to be different by $(2m-1)\pi$ (m is an integer) between that of the grating of the grating coupler 714A and that of the grating of the grating coupler 714B. In the case that the grating pitch of the grating coupler 714A is determined to satisfy δ=κ and the grating pitch of the grating coupler 714B is determined to satisfy δ=−κ, it results in σ=0, thus, it results in $r \propto -1$ and
$r \propto 1$, respectively. In other words, if the respective grating pitches are determined to satisfy the above relationships, the phases of the reflection coefficients become different by n with each other, and the absolute values of the reflectance become substantially the same. By constructing the grating coupler 714A and the grating coupler 714B as explained above, the amplitude of the light reflected by the grating coupler 714A and the amplitude of the light reflected by the grating coupler 714B become substantially the same, and the difference between the phase of the light reflected by the grating coupler 714A and the phase of the light reflected by the grating coupler 714B becomes n; thus, the reflected light from the grating coupler 714A and the reflected light from the grating coupler 714B can be cancelled out in the optical branching part 710. It is also possible to adjust the reflection coefficient r by changing the depth, the length L, the coupling constant κ, and the duty ratio of the grating, instead of changing the pitch of the grating.

According to the present invention, the same manufacturing process can be used for producing the grating coupler 714A and the grating coupler 714B. Thus, reproducibility of manufacturing of the optical circuit 700 can be enhanced, while obtaining the effect such that the reflected light occurred in the grating coupler is cancelled out.

In the embodiment of the present invention, the construction of the cross section of the optical waveguide 712A and that of the optical waveguide 712B may be the same.

In the embodiment of the present invention, the refractive index of the waveguide may be changed due to the effect of temperature. In the embodiment of the present invention, in the optical circuit 700, it is desirable that the refractive index of the optical waveguide 712A and that of the optical waveguide 712B change similarly to correspond to the change in the ambient temperature. In the case that one waveguide only is affected by the change in temperature, the optical path length of the one waveguide only is changed; and, in the case that the lengths of the optical paths are long, the phases of the two waveguides will be changed largely. The optical waveguide 712A and the optical waveguide 712B may be placed in such a manner that they are separated from each other for a distance that prevents them from being coupled with each other as a directional coupler, and that they are placed close enough with each other (in parallel, for example). According to such an embodiment, the refractive indexes of the optical waveguide 712A and the optical waveguide 712B are changed similarly, due to the effect of heat generated by an IC, a semiconductor laser, and so on. Consequently, the effect of the change in temperature, that is to be influenced, depends on the difference between the length of the optical waveguide 712A and that of the optical waveguide 712B. For example, a case that the reflection coefficients of the grating coupler 714A and the grating coupler 714B are the same and the absolute values and the phases of the reflection coefficients are also the same will be considered. It is also supposed that the optical path length of the optical waveguide 712A is L+((m−1/2)λ)/2, and the optical path length of the optical waveguide 712B is L. Under the above condition, and due to the change in temperature, if the value of the refractive index is changed to a value equal to (1+α) times of the value of the refractive index, the optical path length of the optical waveguide 712A becomes (1+α)(L+((m−1/2)λ)/2), the optical path length of the optical waveguide 712B becomes (1+α)L, and the length difference between the two optical paths becomes (1+α) ((m−1/2)λ)/2. If m is 1, the optical path length difference becomes (1+α)λ/4. Since a is small, the difference between the round-trip optical paths becomes (1+α)λ/2~λ/2, and the difference of the phases of the round trips is kept to be π. Although the difference between phases of the round trips of the waveguides is set to be π in this case, the value to be set is not limited to this; and control for generating a desirable phase difference between waveguides is facilitated. It is desirable that the distance between the optical waveguide 712A and the optical waveguide 712B is set to be equal to or less than 50 μm.

Also, it may be possible to intentionally construct the optical waveguides 712A and 712B in such a manner that the constructions of the cross sections of them are different with each other so as to generate a desired phase difference. For example, the optical waveguides 712A and 712B may be constructed in such a manner that their effective refractive indexes are different. In an embodiment, the optical waveguides 712A and 712B may be constructed in such a manner that the refractive indexes of the cores and the clads are made to be different, the diameters of the cores are made to be different, or the like, for setting the phase difference between the phase of the light returned via the optical waveguide 712A to the optical branching part 710 and the phase of the light returned via the optical waveguide 712B to the optical branching part 710, at the optical branching part 710, to be (2m−1)π (m is an integer).

As explained above, the optical circuit 700 of the present embodiment has a characteristic construction such that the light outputted from the optical modulator 708A is branched to two optical waveguides 712A and 712B by the optical branching part 710, and, further, the optical signals propagating through the two optical waveguides 712A and 712B are coupled to one optical waveguide 718 by use of two grating couplers 714A and 714B.

In the present embodiment, the optical circuit 700 may be constructed in such a manner that the grating couplers 714A and 714B couple the optical signals diffracted thereby to the same multimode optical waveguide 718. The multimode optical waveguide 718 may comprise a multimode optical fiber, for example.

For example, the grating couplers 714A and 714B may be constructed in such a manner that, at an incident end of the multimode optical waveguide 718, the spot size of the light reflected by each of the grating couplers 714A and 714B is made to be fit within the core of the multimode optical waveguide 718. For example, the multimode optical waveguide 718 may comprise a multimode optical fiber having a core diameter of approximately 50 μm, and each of the grating couplers 714A and 714B may be constructed in such a manner the spot size of the light refracted by it is approximately 10 μm. According to this example, only by closely placing the grating couplers 714A and 714B with each other with an appropriate distance therebetween, and without using any additional special optical elements, both of the optical signals diffracted by the grating couplers 714A and 714B respectively can be coupled to the same multimode optical waveguide 718. Thus, compared with the embodiments shown in FIGS. 1 and 2, the power of the optical signal coupled to the optical waveguide 718 and transmitted therethrough can be increased.

In the case that the optical circuit 700 is constructed to use a multimode optical waveguide 718 that may comprise a multimode optical fiber as is the case of this embodiment, it becomes possible to couple both of the light diffracted by the grating coupler 714A and the light diffracted by grating coupler 714B to the same multimode optical waveguide 718 to thereby reduce optical loss due to intentional branching by the optical branching part 710, in addition to making possible to lessen instability of the operation of the light source due to reflection of light outputted from the optical modulator 708A. In each of the embodiments shown in FIGS. 1 and 2, although adverse effect due to the reflected light from optical elements placed in the downstream side of the optical modulator 108A can be reduced, the power of the optical signal coupled to the optical waveguide 118 is reduced (for example, to ½ of it). On the other hand, according to the present embodiment, the problem of attenuation of the power of the optical signal can be solved at the same time.

Further, according to the present embodiment, similar to those of FIGS. 1 and 2, the optical circuit 700 can be manufactured at low cost, since it is not necessary to place an expensive optical isolator on the output end of the optical source 702. In the case that a silicon photonics technique is used to form the optical circuit 700 on a SOI substrate, the optical circuit 700 having the above characteristics can be highly integrated on the substrate by use of silicon processes. Thus, the optical circuit 700 can be downsized, the manufacturing process can be simplified, and the manufacturing cost can be reduced. Further, in the case that that a multimode optical waveguide is used as the optical waveguide 718 for transmitting optical signals, tolerance for an error of alignment between the optical circuit 700 and the optical waveguide 718, when the optical circuit 700 is highly integrated on the SOI substrate and downsized, can be increased.

Figure 8:
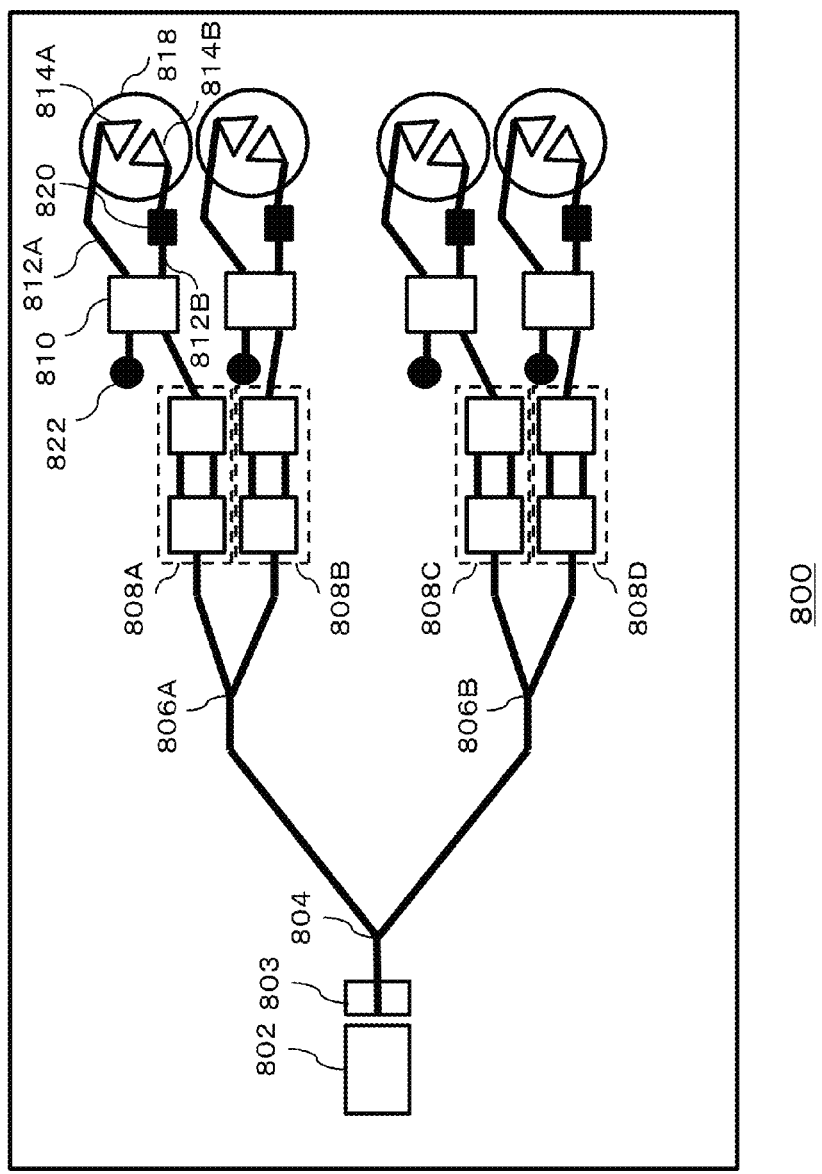
FIG. 8 is a drawing schematically showing an optical circuit according to an embodiment of the present invention.

FIG. 8 schematically shows an optical circuit 800 according to another embodiment of the present invention. In the optical circuit 800, in addition to a construction similar to that of the optical circuit 700 shown in FIG. 7, an optical branching part 810 is constructed as a coupler having at least two inputs and at least two outputs (for example, a 2×2 coupler). The light from a modulator 808 is divided into two parts by an optical branching part 810, and the two parts of the light are coupled to optical waveguides 812A and 812B respectively. The optical circuit 800 further comprises an optical phase adjusting part 820 on the optical waveguide 812B. A first input of the two inputs of the optical branching part 810 is connected to an optical modulator 808A, and a second input is connected to an optical detector 822 comprising a photodiode or the like. The optical phase adjusting part 820 may be constructed to have a MOS structure, a PN structure, or the like, or constructed as a heater or the like.

In the optical circuit 800, among parts of the light returned to the optical branching part 810, the power of light returned to the second input is monitored by the optical detector 822. When the optical power to be detected by the optical detector 822 becomes maximum, the optical power returned from the first input of the optical branching part 810 to the optical modulator 808A becomes minimum. At that time, the phase difference between the phase of the light reflected by the grating coupler 814A and returned to the first input of the optical branching part 810 and the phase of the light reflected by the grating coupler 814B and returned to the first input of the optical branching part 810 is (2m−1)π (m is an integer). Thus, the operation of the light source 802 can be stabilized by controlling the optical phase adjusting part 820 in such a manner that the optical power to be detected by the optical detector 822 is made to be maximum. According to the construction shown in FIG. 8, in addition to having the effect derived from the optical circuit 700 shown in FIG. 7, the optical power returning to the optical modulator 808A can be minimized, and the operation of the light source 802 can be stabilized, even if dispersion of production in terms of length of the optical waveguides 812A and 812B exists.

Figure 9:
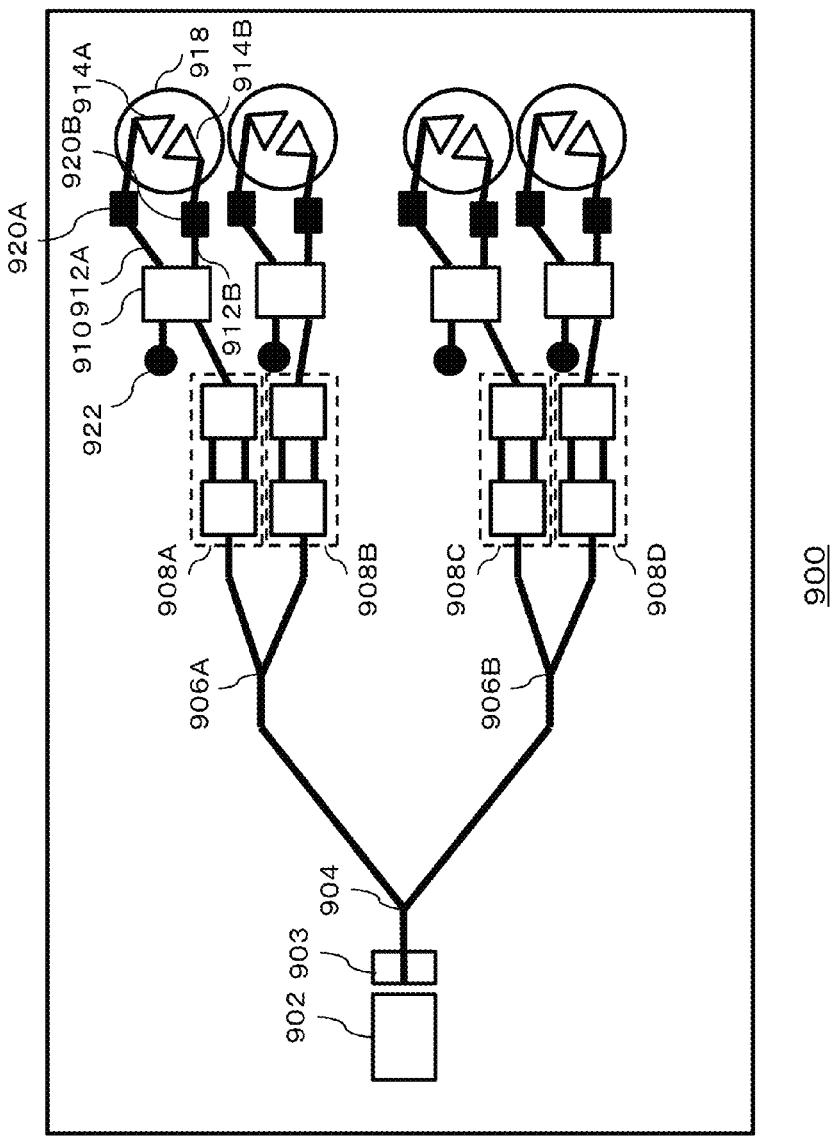
FIG. 9 is a drawing schematically showing an optical circuit according to an embodiment of the present invention.

FIG. 9 shows an optical circuit 900 according to another embodiment of the present invention. The optical circuit 900 comprises a construction similar to that of the optical circuit 800 shown in FIG. 8, and additionally comprises an optical phase adjusting part 920A on an optical waveguide 912A. The optical phase adjusting part 920A is constructed in such a manner that it has an optical loss equivalent to that of an optical phase adjusting part 920B. In the operation of the optical circuit 900, the optical phase adjusting part 920B is driven in such a manner that the optical power to be detected by an optical detector 922 is made to be maximum; and, on the other hand, the optical phase adjusting part 920A is not driven. According to the construction shown in FIG. 9, the optical loss of an optical waveguide 912A is equivalent to the optical loss of an optical waveguide 912B. Thus, the optical power reflected by a grating coupler 914A and returned to an optical branching part 910 and the optical power reflected by a grating coupler 914B and returned to the optical branching part 910 become approximately equal with each other; therefore, the optical power returning from the optical branching part 910 to an optical modulator 908A can be made minimum, by controlling the optical phase adjusting part 920B in such a manner that the light detected by the optical detector 922 becomes maximum.

Figure 10:
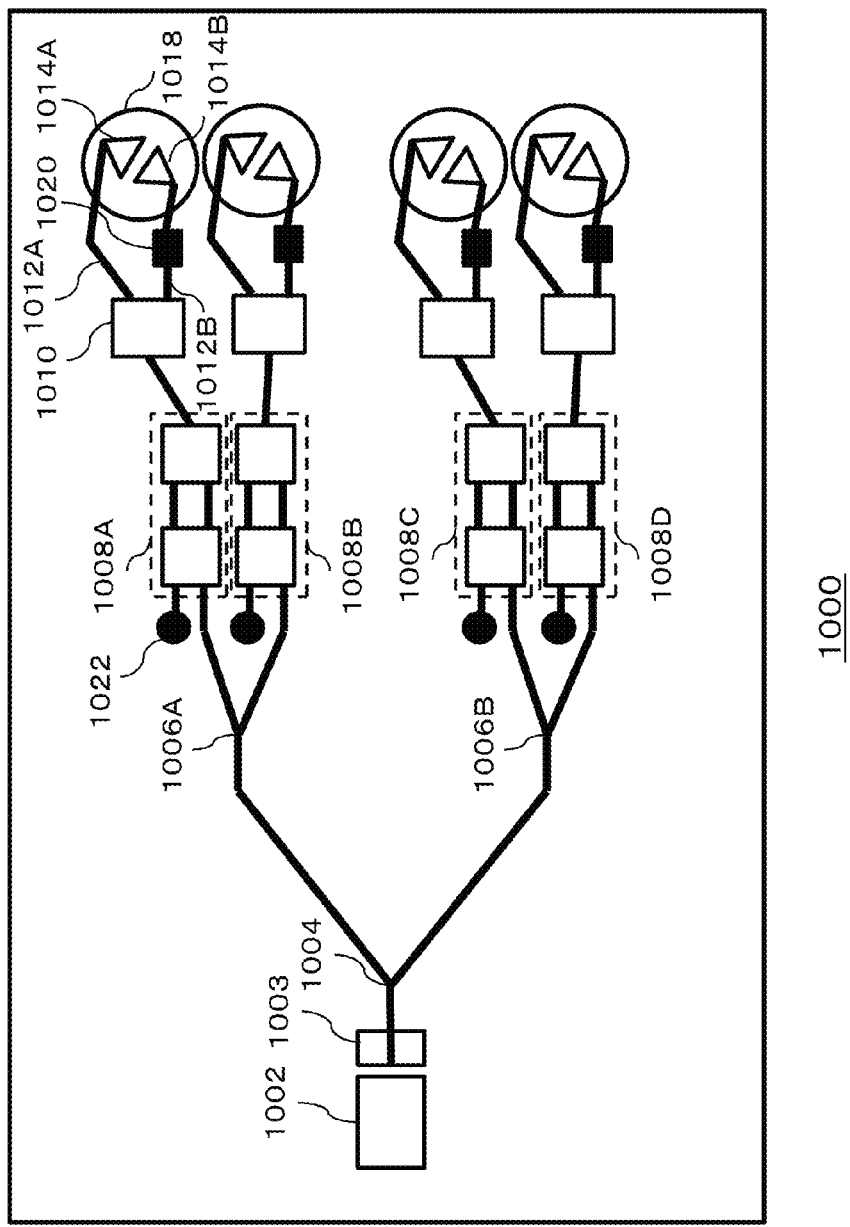
FIG. 10 is a drawing schematically showing an optical circuit according to an embodiment of the present invention.

FIG. 10 shows an optical circuit 1000 according to another embodiment of the present invention. In the optical circuit 1000, an optical coupling part 1010 comprises an input; and an optical detector 1022 is connected to one of inputs of an optical modulator 1008A. The optical circuit 1000 can stabilize the operation of a light source 1002 by controlling an optical phase adjusting part 1020 in such a manner that the optical power to be detected by the optical detector 1022 is made to be minimum. The condition of driving of the optical phase adjusting part 1020 that results in minimization of the optical power at the optical detector 1022 (for example, an applied voltage, in the case that the optical phase adjusting part 1020 comprises a MOS structure) may be directly determined. In addition, it may be possible to determine one driving condition of the optical phase adjusting part 1020 that maximizes the optical power at the optical detector 1022, and determine another driving condition of the optical phase adjusting part 1020 that provides a next large optical power, and drive the optical phase adjusting part 1020 by using a value of a driving condition between those of the above two driving condition. Although the optical phase adjusting part is formed only on the side of a waveguide 1012B in this embodiment, in view of adjustment of returning optical power, it may be possible to form another optical phase adjusting part on the side of a waveguide 1012A in a manner similar to that of the optical circuit 900.

In view of reduction of dispersion of production, it is preferable that the two grating couplers 814A and 814B, 914A and 914B, and 1014A and 1014B are made to have the same constructions. Further, in view of maximum suppression of returning light, it is preferable that each of the optical branching parts 810, 910, and 1010 is constructed to equally divide the light from the modulator into two parts to be branched to two waveguides that are connected to the grating couplers. However, in the case that the optical adjustment part 810 is formed on one side only like the case of the optical circuit 800, and that the absolute values of the optical powers returned to the optical branching part are different, the returning optical power may be adjusted by changing the ratio of branching of the optical branching part, by design.

Note that it is possible to construct the optical circuit 900 shown in FIG. 9 in such a manner that the optical detector 922 is connected to one of inputs of the optical modulator 928A in a manner similar to that of FIG. 6. Further, in the optical circuit 1000 shown in FIG. 10, another optical phase adjusting part may be formed on the optical waveguide 1012A, like the construction shown in FIG. 9.

Figure 11:
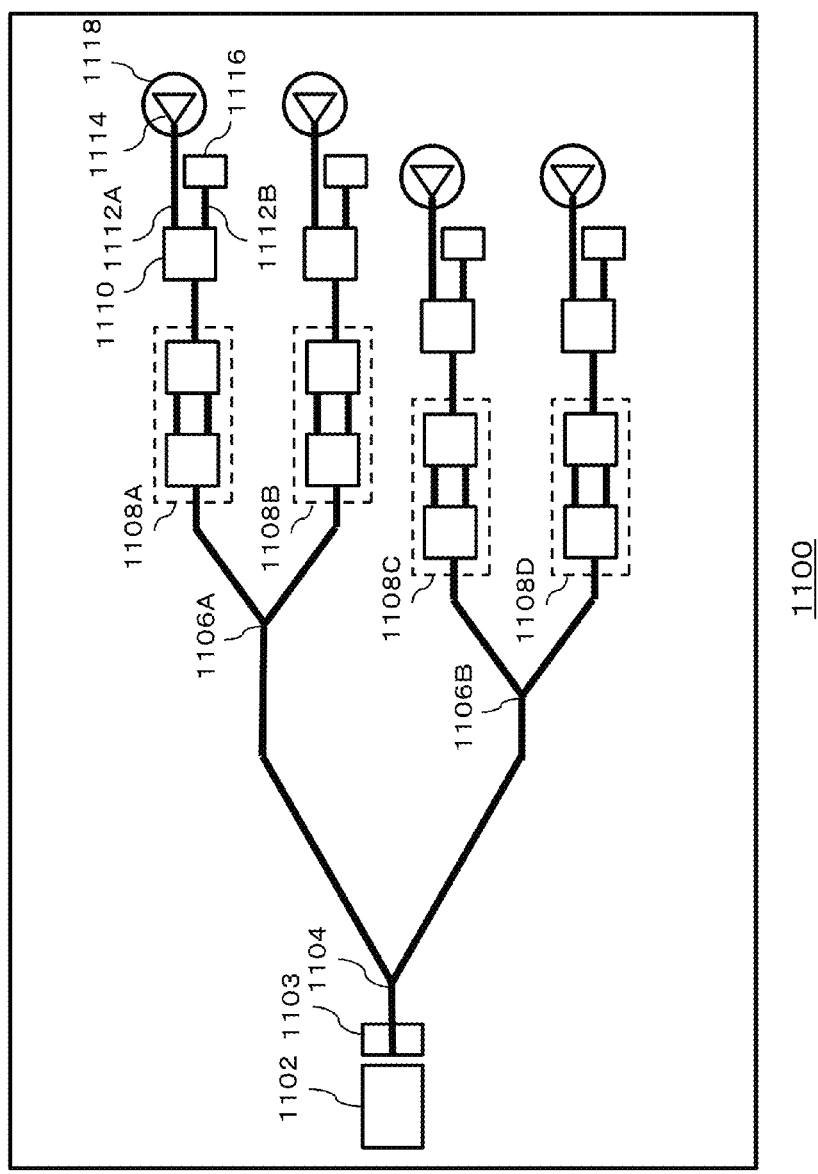
FIG. 11 is a drawing schematically showing an optical circuit according to an embodiment of the present invention.

FIG. 11 schematically shows an optical circuit 1100 according to another embodiment of the present invention. The constructions of the parts following optical modulators 1108A to 1108D are the same as those of the embodiment shown in FIG. 1. In this embodiment, the optical circuit 1100 is constructed in such a manner that the difference between the phase of the reflected light from the optical modulators 1108A and 1108B and the phase of the reflected light from the optical modulators 1108C and 1108D, at a point before the optical source 1102, becomes (2m−1)π (m is an integer). Preferably, m=1 or m=0. For achieving the above object, it is constructed, for example, that the round-trip optical path length between the optical modulators 1108A and 1108B and the optical source 1102 and the round-trip optical path length between the optical modulators 1108C and 1108D and the optical source 1102 are different by (m−1/2)λ (m is an integer, and λ is a wavelength of the light emitted from the light source 1102). According to the present embodiment, by constructing the optical circuit 1100 as explained above, the problem relating to reflected light from the optical modulators, in addition to the problem relating to reflected light from optical elements following the optical modulators, can be solved.

Also, the optical circuit 1100 may be constructed in such a manner that the phase difference between the phase of the reflected light from the optical modulator 1108A and the phase of the reflected light from the optical modulator 1108B, at a point before the optical source 1102, becomes (2m−1)π (m is an integer), and that the phase difference between the phase of the reflected light from the optical modulator 1108C and the phase of the reflected light from the optical modulator 1108D, at a point before the optical source 1102, becomes (2m−1)π (m is an integer). Also, the optical circuit 1100 may be constructed in such a manner that the phase difference between the phase of the reflected light from the optical modulator 1108A and the phase of the reflected light from the optical modulator 1108C, at a point before the optical source 1102, becomes (2m−1)π (m is an integer), and the phase difference between that the phase of the reflected light from the optical modulator 1108B and the phase of the reflected light from the optical modulator 1108D, at a point before the optical source 1102, becomes (2m−1)π (m is an integer).

In the present invention, an optical path length can be represented by multiplying a propagated distance of light (d) by an effective refractive index of the propagating light (n). Thus, the optical path length can be changed by changing the length of a straight part of a waveguide by shifting positional relationships between optical elements such as branching elements. Also, the optical path length can be changed by changing a bend radius of an optical waveguide between optical elements, without changing positions of the optical elements. A waveguide may have a bended part having a bend angle of 90 degrees, and/or a bended part have another bend angle. Also, by changing the width of an optical waveguide to thereby change the effective refractive index, it becomes possible to vary the optical path length. Further, by changing the height of the optical waveguide, the temperature of the optical waveguide, the stress applied to the optical waveguide (for example, by covering one or more waveguides by a film that can exert strong stress), and/or at least one material of the core or the clad of the optical waveguide, it becomes possible to vary the optical path length.

Although the present invention has explained with reference to specific embodiments, it is intended that the embodiments described in this specification is not used to interpret the present invention in a limiting way, and that the embodiments described in this specification is used as examples to explain the present invention. It is obvious for a person skilled in the art that other alternative embodiments can be implemented without departing from the scope of the present invention.

The invention claimed is:

1. An optical circuit comprising:
a first branching part configured to branch light;
a first optical coupler configured to couple first branched light in the branched light to a first optical waveguide for transmission; and
an optical reflection part configured to reflect second branched light in the branched light;
wherein, at an input side of the first branching part, a phase difference between reflected light from the first optical coupler and reflected light from the optical reflection part is $(2m-1)\pi$, wherein m is an integer, and
wherein the optical reflection part is a second optical coupler, and diffracted light from the first optical coupler and diffracted light from the second optical coupler are both transmitted to the first optical waveguide.

2. The optical circuit according to claim 1, wherein a difference between a length of a second optical waveguide between the first branching part and the first optical coupler and a length of a third optical waveguide between the first branching part and the optical reflection part is equal to or less than one hundredth of $(c/ng)\times(1/k)$ (unit thereof is meter (m)), wherein ng is a group refractive index of the second optical waveguide and the third optical waveguide, c (m/s) is the velocity of light, and k (bps) is a transmission rate of a signal.

3. The optical circuit according to claim 2, wherein the first branching part comprises at least two inputs; an optical detector is connected to one of the at least two inputs; a first optical phase adjusting part is provided on the third optical waveguide; and the first optical phase adjusting part is controllable in such a manner that optical power detected by the optical detector is made maximum.

4. The optical circuit according to claim 3, wherein a second optical phase adjusting part is provided on the second optical waveguide.

5. The optical circuit according to claim 2 further comprising:
a light source, and
an optical modulator configured to modulate light emitted from the light source and output a modulated optical signal;
wherein the optical modulator comprises at least two inputs; an optical detector is connected to one of the at least two inputs; an output of the optical modulator is connected to the first branching part; a first optical phase adjusting part is provided on the third optical waveguide; and the first optical phase adjusting part is controllable in such a manner that optical power detected by the optical detector is made minimum.

6. The optical circuit according to claim 5, wherein a second optical phase adjusting part is provided on the second optical waveguide.

7. The optical circuit according to claim 1, wherein the first optical coupler and the second optical coupler comprise a first grating coupler and a second grating coupler, respectively; and the first optical waveguide comprises a multimode optical waveguide.

8. The optical circuit according to claim 7, wherein the optical circuit is formed on a same substrate; and the first grating coupler and the second grating coupler are placed in parallel with each other; and diffraction angles of the first grating coupler and the second grating coupler with respect to the substrate are the same and are oppositely oriented with each other.

9. The optical circuit according to claim 7, wherein the first grating coupler and the second grating coupler are placed in parallel with each other; a grating of the first grating coupler is formed to be slanted with respect to the second optical waveguide; a grating of the second grating coupler is formed to be orthogonal to the third optical waveguide; and the first grating coupler and the second grating coupler are constructed in such a manner that absolute values of reflection coefficients of them are approximately the same, although phases of the reflection coefficients of them are different from each other.

10. An optical circuit comprising:
a first branching part configured to branch light;
a first optical coupler configured to couple first branched light in the branched light to a first optical waveguide for transmission;
an optical reflection part configured to reflect second branched light in the branched light;
a light source;
a second branching part configured to branch light emitted from the light source;
a first optical modulator configured to modulate a first part of light from the second branching part and output a modulated optical signal; and
a second optical modulator configured to modulate a second part of the light from the second branching part and output a modulated optical signal;
wherein, at an input side of the first branching part, a phase difference between reflected light from the first optical coupler and reflected light from the optical reflection part is $(2m-1)\pi$, wherein m is an integer, and
wherein, at an input side of the second branching part, a phase difference between reflected light from the first optical modulator and reflected light from the second optical modulator is $(2m-1)\pi$, wherein m is an integer.

11. The optical circuit according to claim 1, wherein the optical reflection part comprises a reflection coefficient that is the same as that of the first optical coupler.

12. The optical circuit according to claim 1, wherein a difference between a phase of the reflection coefficient of the first optical coupler and a phase of the reflection coefficient of the optical reflection part is $\phi$; and a difference between an optical path length between an input side of the first branching part and the first optical coupler and an optical path length between the input side of the first branching part and the optical reflection part is $((m-1/2)-\phi/\pi/2)\lambda/2$, wherein m is an integer, and $\lambda$ is a wavelength of light.

13. The optical circuit according to claim 1, wherein, regarding the first branching part comprising the 1×2 construction comprising a branching construction in which one input is provided and no phase differences between phases at two output sides are generated, an optical path length between the first branching part and the first optical coupler and an optical path length between the first branching part and the optical reflection part are the same; and a phase difference between a phase of light reflected from the first optical coupler at an incident end of the first optical coupler and a phase of light reflected from the optical reflection part at an incident end of the optical reflection part is $(2m-1)\pi$, wherein m is an integer.

14. An optical circuit comprising:
a first branching part configured to branch light;
a first optical coupler configured to couple first branched light in the branched light to a first optical waveguide for transmission; and
an optical reflection part configured to reflect second branched light in the branched light;
wherein, at an input side of the first branching part, a phase difference between reflected light from the first optical coupler and reflected light from the optical reflection part is $(2m-1)\pi$, wherein m is an integer,
wherein, regarding the first branching part comprising the 1×2 construction comprising a branching construction in which one input is provided and no phase differences between phases at two output sides are generated, an optical path length between the first branching part and the first optical coupler and an optical path length between the first branching part and the optical reflection part are the same; and a phase difference between a phase of light reflected from the first optical coupler at an incident end of the first optical coupler and a phase of light reflected from the optical reflection part at an incident end of the optical reflection part is $(2m-1)\pi$, wherein m is an integer, and
wherein the optical circuit is formed on a same substrate; the first optical coupler and the optical reflection part comprise a first grating coupler and a second grating coupler, respectively; and pitches of gratings of the first grating coupler and the second grating coupler are determined in such a manner that detuning for the first grating coupler is made to be $\delta=\kappa$ and detuning for the second grating coupler is made to be $\delta=-\kappa$, wherein $\kappa$ is a coupling constant, $\delta=\beta-K$, $\beta$ is a propagation coefficient of light, $K=2\pi/\Lambda$, and $\Lambda$ is a grating pitch.

15. The optical circuit according to claim 10, wherein a fourth optical waveguide extending from the second branching part to the first optical modulator and a fifth optical waveguide extending from the second branching part to the second optical modulator are placed in such a manner that they are separated from each other for a distance that prevents them from being coupled with each other as a directional coupler, and that they are placed in parallel with each other with a distance equal to or less than 50 μm therebetween.

16. The optical circuit according claim 1, wherein a second optical waveguide extending from the first branching part to the first optical coupler and a third optical waveguide extending from the first branching part to the optical reflection part are placed in such a manner that they are separated from each other for a distance that prevents them from being coupled with each other as a directional coupler, and that they are placed in parallel with each other with a distance equal to or less than 50 μm therebetween.

17. The optical circuit according to claim 1, wherein a phase difference is generated by changing an optical path length of an optical waveguide by at least one of
(a) changing the length of a straight part of the optical waveguide,
(b) changing the bend radius of the optical waveguide,
(c) changing the width of the optical waveguide,
(d) changing the height of the optical waveguide,
(e) changing the temperature of the optical waveguide,
(f) changing the stress applied to the optical waveguide, and
(g) changing at least one material of the core or the clad of the optical waveguide.

* * * * *